(12) United States Patent
Chang

(10) Patent No.: US 8,609,982 B2
(45) Date of Patent: Dec. 17, 2013

(54) THIN FILM SOLAR CELL WITH GRADED BANDGAP STRUCTURE

(75) Inventor: Chun-Yen Chang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 171 days.

(21) Appl. No.: 13/022,893

(22) Filed: Feb. 8, 2011

(65) Prior Publication Data

US 2011/0197956 A1 Aug. 18, 2011

(30) Foreign Application Priority Data

Feb. 12, 2010 (TW) .............................. 99104561 A

(51) Int. Cl.
*H01L 31/06* (2012.01)
(52) U.S. Cl.
USPC .............. 136/255; 136/256; 136/252; 438/74
(58) Field of Classification Search
USPC .............................. 136/255, 256, 252; 438/74
See application file for complete search history.

(56) References Cited

U.S. PATENT DOCUMENTS

| | | | | | |
|---|---|---|---|---|---|
| 4,598,164 | A | * | 7/1986 | Tiedje et al. ................... | 136/249 |
| 5,107,306 | A | * | 4/1992 | Blood et al. ..................... | 257/11 |
| 5,900,071 | A | * | 5/1999 | Harman ....................... | 136/236.1 |
| 8,143,513 | B2 | * | 3/2012 | Chiou et al. ................... | 136/255 |
| 2007/0108888 | A1 | * | 5/2007 | Chen et al. ..................... | 313/503 |
| 2007/0272297 | A1 | * | 11/2007 | Krivoshlykov et al. ........ | 136/256 |
| 2008/0173350 | A1 | * | 7/2008 | Choi et al. ..................... | 136/258 |
| 2008/0188033 | A1 | * | 8/2008 | Choi et al. ..................... | 438/96 |
| 2008/0223440 | A1 | * | 9/2008 | Sheng et al. ................... | 136/258 |
| 2008/0245414 | A1 | * | 10/2008 | Sheng et al. ................... | 136/261 |
| 2010/0258169 | A1 | * | 10/2010 | Sheng et al. ................... | 136/255 |
| 2010/0269896 | A1 | * | 10/2010 | Sheng et al. ................... | 136/255 |
| 2011/0048499 | A1 | * | 3/2011 | Myong ......................... | 136/246 |
| 2011/0240121 | A1 | * | 10/2011 | Dalal ............................ | 136/258 |

OTHER PUBLICATIONS

Study of a-SiGe:H films and n-i-p devices used in high efficiency triple junction solar cells, Journal of Non-Crystalline Solids 299-302 (2002) 1213-1218.
Growth and properties of SiGe multicrystals with microscopic compositional distribution for high-efficiency solar cells, Solar Energy Materials & Solar Cells 73 (2002) 305-320.
Micro-fabrication techniques applied to aluminosilicate glass surfaces: Micro-indentation and wet etching process, Thin Solid Films 517 (2009) 2900-2904.

(Continued)

*Primary Examiner* — Golam Mowla
(74) *Attorney, Agent, or Firm* — Bui Garcia-Zamor; Jessica H. Bui, Esq.

(57) ABSTRACT

A thin film solar cell with a graded bandgap structure comprises a front contact, a first light absorption layer, a transition layer, a second light absorption layer and a back contact. The first light absorption layer is formed on the front contact, the transition layer is formed on the first light absorption layer, the second light absorption layer is formed on the transition layer, and the back contact is formed on the second light absorption layer, wherein the transition layer has a graded bandgap, which is made by alternating a layer of the first superlattice layers, having a first bandgap, with a layer of the second superlattice layers, having a second bandgap, in a tandem arrangement, based on the condition that the thickness of each layer of the first and the second superlattice layers is varied increasing, decreasing or increasing first and then decreasing.

6 Claims, 23 Drawing Sheets

(56) References Cited

OTHER PUBLICATIONS

Mechanism of the etching rate change of aluminosilicate glass in HF acid with micro-indentation, Applied Surface Science 255 (2008) 2290-2294.

Investigation of graded index $SiO_xN_y$ antireflection coating for silicon solar cell manufacturing, phys. stat. sol. (c) 4, No. 4, 1566-1569 (2007) / DOI 10.1002/pssc. 200674143.

Ge nanocrystal charge trapping devices fabricated by one-step oxidation on poly-SiGe, Applied Surface Science 255 (2008) 2512-2516.

Low-Temperature Poly-SiGe Alloy Growth of High Gain/Speed Pin Infrared Photosensor With Gold-Induced Lateral Crystallization (Au-ILC), IEEE Transactions on Electron Devices, vol. 50, No. 8, Aug. 2003.

* cited by examiner

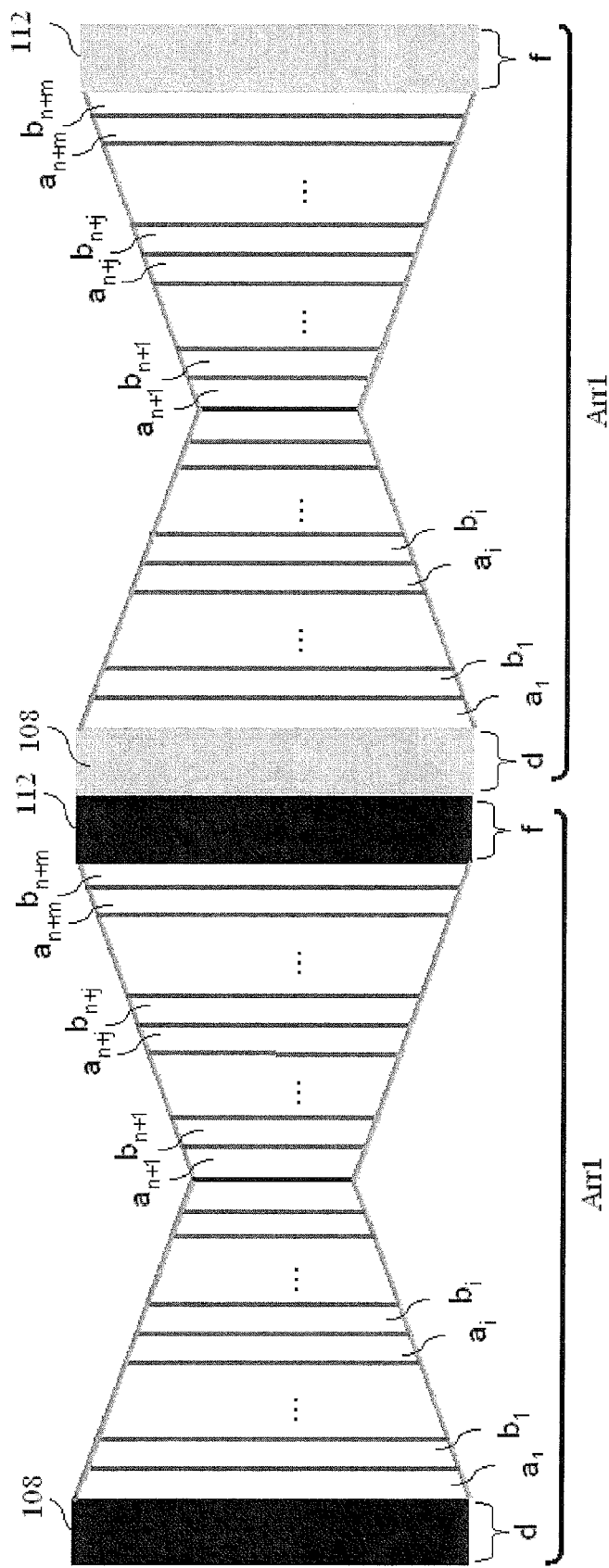

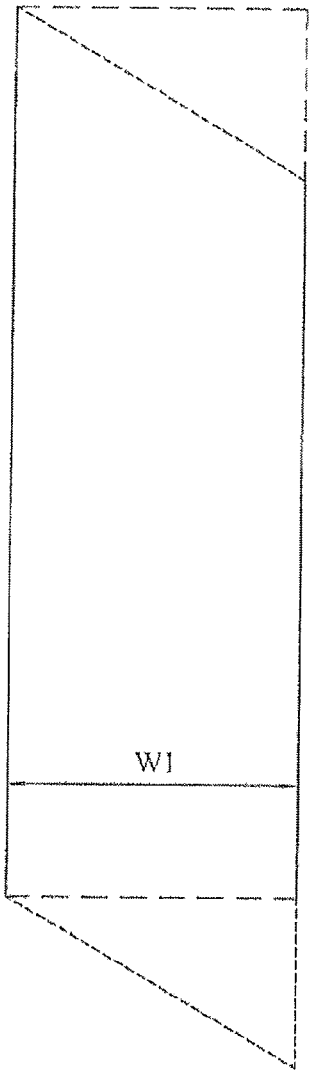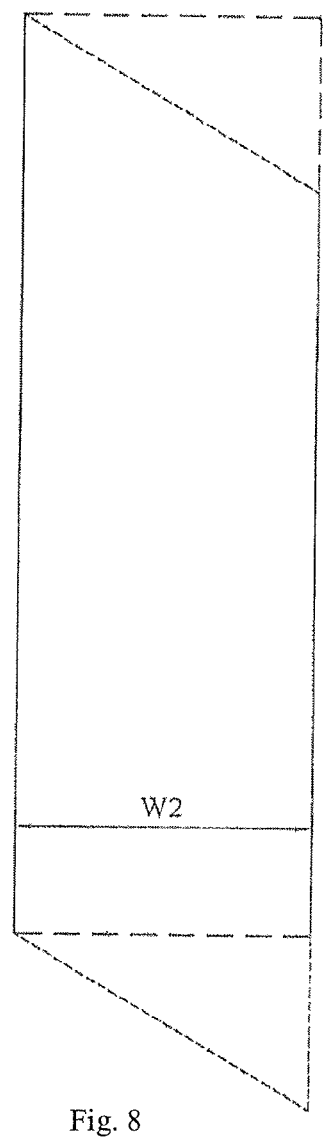
Fig. 5
Fig. 8

THIN FILM SOLAR CELL WITH GRADED BANDGAP STRUCTURE

BACKGROUND OF THE INVENTION

1. Field of the Invention

The present invention relates to a solar cell, and particularly to a multi-junction silicon thin-film solar cell.

2. Description of the Related Art

Solar cells are classified a silicon solar cell, a compound semiconductor solar cell, and an organic solar cell according to materials, and wherein they can be further subdivided into a bulk type, a thin-film type, a single crystal type and a poly-crystal type based on crystallization morphologies and elemental structures.

A general solar cell comprises a p-n junction structure formed by combining a p-type semiconductor and an n-type semiconductor. A strong electric field to pull electrons towards an n-type side and holes towards a p-type side occurs at the p-n junction. That is, at the p-n junction, electrons like children sliding down a slide and holes like bubbles in water floating up move towards opposite directions. In other words, the p-n junction functions to separate electrons and holes.

Although a compound semiconductor (fox example, CIGS or CdTe) solar cell has a higher conversion efficiency, manufacture of the compound semiconductor is costly due to use of rare element, and Cd and Te are toxic substances, easily resulting in environmental pollution. Consequently, the silicon solar cell remains being a mainstream of commercialized solar cells.

Today, the bulk-type crystal silicon solar cell has a great market share of solar cells. However, since the thin-film silicon solar cell has a thickness in semiconductor layer, which is $1/10 \sim 1/100$ of that of the bulk crystal silicon solar cell, it is prevented from the problem of the shortage of silicon raw material to which the production of the bulk crystal silicon solar cell is subjected, and it can be expected to greatly reduce costs. Therefore, it draws much attentions to be a next generation solar cell.

Further, in the thin-film silicon solar cells, the amorphous silicon (a-Si) solar cell is most popular. Although the a-Si solar cell has a high optical absorption coefficient and can be manufactured in several hundreds of nanometers in film thickness, its conversion efficiency is degraded by 10% under light irradiation. As compared with the a-Si solar cells, the crystal silicon (c-Si) thin-film solar cells (here, microcrystalline Silicon (μc-Si) or polysilicon (poly-Si) are totally referred to as crystal silicon), which can be manufactured in the same way as that of the a-Si solar cell, can absorb a light having a longer wavelength band without photodegradation. Therefore, a thin-film solar cell having a higher conversion efficiency can be manufactured by laminating the above-stated two solar cells. In FIG. 1, a conventional tandem cell with an a-Si solar cell functioning as a top cell and a c-Si solar cell functioning as a bottom cell, is shown. Since the top solar cell and the bottom solar cell can absorb light with short and medium wavelength bands of an incident light, respectively, in high efficiency, solar spectrum can be efficiently used with wider wavelength band being covered.

FIG. 1 shows a schematic structure of a conventional a-Si/c-Si tandem solar cell 1 having a p-i-n junction. The tandem solar cell 1 is formed with an a-Si cell 22 made of a $p^+$-type a-Si layer 16, an n-type or i-type a-Si layer 18, and an $n^+$-type a-Si layer 20; a transparent conductive oxide layer 24; a c-Si cell 32 made of a $p^+$-type poly-Si or μc-Si layer 26, an i-type poly-Si or μc-Si layer 28, and an $n^+$-type poly-Si or μc-Si layer 30; a metal electrode 34 made of Ag or Al; and a passivation layer 36 made of $SiN_x$, on a glass substrate 12 having an anti-reflective coating 10 and a textured transparent conductive oxide layer 14, in order.

FIG. 2 is a flow chart of manufacturing the a-Si/c-Si tandem solar cell having a p-i-n junction as shown in FIG. 1. An anti-reflective coating (ARC) 10 is grown on a glass substrate 12 by high density plasma chemical vapor deposition (HD-PCVD) or plasma enhanced chemical vapor deposition (PECVD) (step S10) to reduce the reflection of light on the solar cell surface. A transparent conductive oxide layer (TCO) 14, such as ITO or $SnO_2/ZnO$, is grown by sputtering (step S20). In order to efficiently use a light incident to the cell, the transparent conductive oxide layer 14 is textured by wet etching (step S30). Next, a $p^+$-type a-Si layer 16, an n-type or i-type a-Si layer 18, and an $n^+$-type a-Si layer 20 in an amorphous silicon (a-Si) cell 22 are grown in order by HDPCVD (steps S40, S50, and S60). A transparent conductive oxide layer (TCO) 24, such as ITO or $SnO_2/ZnO$, is grown by sputtering (step S70). Then, a $p^+$-type poly-Si or μc-Si layer 26, an i-type poly-Si or μc-Si layer 28, and an $p^+$-type poly-Si or μc-Si layer 30 in a crystal silicon (c-Si) cell 32 are grown in order by HDPCVD or PECVD (steps S80, S90, and S100). Next, a metal electrode 34 is formed by sputtering Ag or Al using an E-gun evaporator (step S110). Since the silicon surface of the solar cell is in a state that unstably generated carriers are easy to recombine (i.e., the surface recombination rate is large), $SiN_x$ is grown by HDPCVD or PECVD into a passivation layer 36 (step S120), thereby stabilizing the surface to suppress the losses caused by the surface recombination. Finally, the films are thermally processed by metal rapid thermal annealing (metal RTA) or rapid thermal annealing (RTA) (step S140), to enhance the densification and adhesion of the films.

However, very large contact resistances (referring to the resistances generated by the $n^+$/TCO junction and the TCO/$p^+$ junction), series resistances (referring to the inherent resistances of $n^+$, TCO, and $p^+$), carrier recombination, and inherent light transmittance of TCO exist in the above tandem solar cell having $p^+$-i-(amorphous silicon)-$n^+$/TCO/$p^+$-i-(crystal silicon)-$n^+$ structure, to cause a problem of low conversion efficiency.

SUMMARY OF THE INVENTION

In view of the fact that the prior solar cell has a low conversion efficiency, the present invention enhances the conversion efficiency of the solar cell by means of: (1) confining more lights incident to the element to increase an absorption current; (2) reducing the recombination of minority carriers to increase an open circuit voltage (Voc); and (3) reducing the internal resistance of the element. By painstaking researches, a bandgap engineering technology is proposed, which obtains optimal light absorption effect and conversion efficiency by materials having suitable optical properties and electrical characteristics matched, using existing production equipments and manufacturing process, thereby achieving the present invention which resolves the above problem.

Specifically, in the present invention, a superlattice layer, an amorphous phase SiGe (a-SiGe) layer, a mixed layer of a-Si and μc-Si, or a mixed layer of a-Si and poly-Si is used as a transition layer (tunneling junction) between a large bandgap light absorption layer, such as a-Si, and a small bandgap light absorption layer, such as c-Si. The entire bandgap of the solar cell is made smoother to reduce the probability of hole recombination.

Furthermore, the transition layer may have a gradually-varied bandgap. For example, by continuously adjusting hydrogen content in a process gas during film formation, a layer with a-Si (crystallinity=0%) gradually varied into μc-Si (crystallinity=60~100%) is formed. Since the gradient of the bandgap can create a built-in electric field (built-in electric potential), carriers can be more efficiently accelerated to transmit, and carrier recombination is reduced so as to enhance the ability of transmitting carriers to electrodes.

Moreover, in the prior a-Si/c-Si tandem solar cell, a first light absorption layer made of a-Si absorbs sunlight having a wavelength of 0.2 μm or less, and a second light absorption layer made of c-Si absorbs sunlight having a wavelength of 0.2~0.5 μm. In order to efficiently use all bands in solar spectrum, the second objective of the present invention is to add a μc-Ge (microcrystalline germanium) layer for absorbing a long wavelength light (wavelength of 0.5 μm or more) in the prior tandem solar cell having a two-light absorption layer structure of a-Si/c-Si, to form a tandem solar cell having a three-light absorption layer structure, thereby enhancing light absorption effect. Simultaneously, an a-SiGe layer or a superlattice layer is used as a transition layer between a large bandgap light absorption layer, such as a-Si, and a small bandgap light absorption layer, such as c-Si, and a μc-Si/μc-Ge superlattice layer or a μc-SiGe layer is used as a transition layer between a small bandgap light absorption layer, such as c-Si, and a smaller bandgap light absorption layer, such as μc-Ge. The entire bandgap of the solar cell is made smoother to reduce the probability of hole recombination.

Furthermore, the third objective of the present invention is to replace the light absorption layers having different bandgaps and the transition layers between the light absorption layers in the solar cells of the first and second objectives with superlattice layers according to the concept of a fully graded bandgap. The entire bandgap of the solar cell is fully made smooth. A thin-film solar cell according to the first aspect of the present invention comprises: a front contact; a first light absorption layer, formed on the front contact; a transition layer, formed on the first light absorption layer; a second light absorption layer, formed on the transition layer; and a back contact, formed on the second light absorption layer, wherein the transition layer has a constant bandgap, and is selected from a group consisting of: a superlattice layer, an a-SiGe layer, a mixed layer of a-Si and μc-Si, and a mixed layer of a-Si and poly-Si. Alternatively, the transition layer has a graded bandgap and is selected from a least one of a superlattice layer, an a-SiGe layer, a layer with a-Si gradually varied into μc-Si, and a layer with a-Si gradually varied into poly-Si, wherein the layer with a-Si gradually varied into μc-S or the layer with a-Si gradually varied into poly-Si is formed by continuously adjusting hydrogen content in a process gas during film formation.

Moreover, the front contact is a photosensitive material having a bandgap $Eg1$, the first light absorption layer is a photosensitive material having a bandgap $Eg1$, the transition layer is a photosensitive material having a bandgap $Eg2$, the second light absorption layer is a photosensitive material having a bandgap $Eg3$, the back contact is a photosensitive material having a bandgap $Eg3$, wherein $Eg1 \geq Eg2 \geq Eg3$, $Eg2$ is a graded value from 1.8 eV to 1.1 eV, or $Eg2$ is a constant value between 1.8 eV and 1.1 eV.

Furthermore, the superlattice layer is an n-type, p-type or i-type (intrinsic) semiconductor, the configuration of which is defined as:

$$a_1b_1/a_2b_2/\ldots/a_ib_i/\ldots/a_nb_n$$

$a_i$: the thickness of an a-Si layer with a bandgap $Eg2a$ in a ith unit,
$b_i$: the thickness of a μc-Si or poly-Si layer with a bandgap $Eg2b$ in the $i_{th}$ unit,
the bandgap of the $i_{th}$ unit in the superlattice layer:

$$Eg2_i \approx Eg2a(a_i/(a_i+b_i))+Eg2b(b_i/(a_i+b_i)),$$

$a_{i-1}=a_i$, $b_{i-1}=b_i$, i=1, 2, ..., n, n=1~1000, i.e., $Eg2$ is a constant, and the thickness W1 of the superlattice layer is defined as: 0 nm<W1≤2.5 μm.

Moreover, the superlattice layer is an n-type, p-type or i-type semiconductor, the configuration of which is defined as:

$$a_1b_1/a_2b_2/\ldots/a_ib_i/\ldots/a_nb_n$$

$a_i$: the thickness of an a-Si layer with bandgap $Eg2a$ in a ith unit,
$b_i$: the thickness of a μc-Si or poly-Si layer with bandgap $Eg2b$ in the $i_{th}$ unit,
the bandgap of the $i_{th}$ unit in the superlattice layer:

$$Eg2_i \approx Eg2a(a_i/(a_i+b_i))+Eg2b(b_i/(a_i+b_i)),$$

$a_{i-1}>a_i$, $b_{i-1}<b_i$, i=1, 2, ..., n, n=1~1000, i.e., $Eg2$ is graded, and the thickness W1 of the superlattice layer is defined as: 0 nm<W1≤2.5 μm.

Furthermore, the units constituting the superlattice layer are formed by growing small bandgap materials first and then large bandgap materials, the configuration of which is defined as $b_1a_1/b_2a_2/\ldots/b_ia_i/\ldots/b_na_n$.

Moreover, the units constituting the superlattice layer are formed by growing large bandgap materials first and then small bandgap materials, the configuration of which is defined as $a_1b_1/a_2b_2/\ldots/a_ib_i/\ldots/a_nb_n$.

Furthermore, the a-SiGe layer is an n-type, p-type or i-type semiconductor, the configuration of which is defined as:

$$a\text{-Si}_{1-x}\text{Ge}_x$$

x is a constant and $0.01 \leq x \leq 1$, i.e., $Eg2$ is a constant, and the thickness W1 of the a-SiGe layer is defined as: 0 nm<W1≤2.5 μm.

Moreover, the a-SiGe layer is a modulated doping n-type, p-type or i-type semiconductor, the configuration of which is defined as:

$$a\text{-Si}_{1-x}\text{Ge}_x$$

x is a function of position and $0.01 \leq x \leq 1$, i.e., $Eg2$ is graded, and the thickness W1 of the a-SiGe layer is defined as: 0 nm<W1≤2.5 μm.

Furthermore, the mixed layer of a-Si and μc-Si or the mixed layer of a-Si and poly-Si is a (an) n-type, p-type or i-type semiconductor, the configuration of which is defined as:

$$(a\text{-Si})_{1-x}(\mu c\text{-Si})_x$$

$$(a\text{-Si})_{1-x}(\text{poly-Si})_x$$

x is a constant and $0.01 \leq x \leq 1$, i.e., $Eg2$ is a constant, and the thickness W1 of the mixed layer of a-Si and μc-Si or the mixed layer of a-Si and poly-Si is follows as: 0 nm<W1≤2.5 μm, wherein hydrogen content in a process gas is adjusted during film formation to change the x value.

Moreover, the layer with a-Si gradually varied into μc-Si or the layer with a-Si gradually varied into poly-Si is an n-type, p-type or i-type semiconductor, the configuration of which is defined as:

$$(a\text{-Si})_{1-x}(\mu c\text{-Si})_x$$

$$(a\text{-Si})_{1-x}(\text{poly-Si})_x$$

x is a function of position and $0.01 \leq x \leq 1$, i.e., Eg2 is graded, and the thickness W1 of the layer with a-Si gradually varied into µc-Si or the layer with a-Si gradually varied into poly-Si is as follows: 0 nm<W1≤2.5 µm, wherein hydrogen content in a process gas is continuously adjusted during film formation to make the x value vary with position.

Furthermore, the transition layer with the graded bandgap comprises a plurality of first superlattice layers and a plurality of second superlattice layers, wherein the plurality of first superlattice layers are made of a photosensitive material with a first bandgap, the plurality of second superlattice layers are made of a photosensitive material with a second bandgap, each one of the plurality of first superlattice layers being alternated with each one of the plurality of second superlattice layers in a tandem arrangement, and the graded bandgap of the transition layer is formed by varying the thickness of at least one of the first superlattice layer and the second superlattice layer. Besides, the first bandgap is larger than that of the second bandgap.

The thickness of each first superlattice layer is gradually thinned towards the second light absorption layer, and the thickness of each second superlattice layer is gradually thickened towards the second light absorption layer, so that a decreasing graded bandgap of the transition layer is gained.

Alternatively, the thickness of each first superlattice layer is gradually thickened towards the second light absorption layer, and the thickness of each second superlattice layer is gradually thinned towards the second light absorption layer, so that a increasing graded bandgap of the transition layer is gained.

Further, the thickness of each first superlattice layer is gradually thinned from an initial thickness to a specific thickness, and then gradually thickened to the initial thickness; the thickness of each second superlattice layer is gradually thickened from an initial thickness to a specific thickness, and then gradually thinned to the initial thickness, so that a graded bandgap of the transition layer which is first decreased and then increased can be gained.

Still further, the thickness of each first superlattice layer is gradually thickened from an initial thickness to a specific thickness, and then gradually thinned to the initial thickness; the thicknesses of each second superlattice layer is gradually thinned from an initial thickness to a specific thickness, and then gradually thickened to the initial thickness, so that a graded bandgap of the transition layer which is first increased and then decreased can be gained.

Preferably, the arrangements mentioned above could be arranged in tandem so as to achieve a better photo-electric conversion efficiency.

Furthermore, the transition layer having graded bandgap further comprises: a layer with a-Si (crystallinity=0%) gradually varied into µc-Si (crystallinity=60~100%), a layer with µc-Si (crystallinity=60~100%) gradually varied into a-Si (crystallinity=0%), a layer with µc-Si gradually varied into µc-Ge, or a layer with µc-Ge gradually varied into µc-Si, formed by continuously adjusting hydrogen content in a process gas during film formation.

A thin-film solar cell according to the second aspect of the present invention comprises: a front contact, having a bandgap Eg1; a first light absorption layer, formed on the front contact and having a bandgap Eg1; a first transition layer, formed on the first light absorption layer and having a bandgap Eg2; a second light absorption layer, formed on the first transition layer and having a bandgap Eg3; a second transition layer, formed on the second light absorption layer and having a bandgap Eg4; a third light absorption layer, formed on the second transition layer and having a bandgap Eg5; and a back contact, formed on the third light absorption layer and having a bandgap Eg5, wherein the configuration and definition of the first transition layer are the same as those of the transition layer in the thin-film solar cell according to the first aspect of the present invention.

The second transition layer has a constant bandgap Eg4 between 1.1 eV and 0.7 eV and is selected from a group consisting of: a superlattice layer of µc-Si and µc-Ge; a superlattice layer of poly-Si and µc-Ge; a µc-SiGe layer; a mixed layer of µc-Si and µc-Ge; and a mixed layer of poly-Si and µc-Ge. Alternatively, the second transition layer has a graded bandgap Eg4 from 1.1 eV to 0.7 eV and is selected from a group consisting of: a superlattice layer of µc-Si and µc-Ge; a superlattice layer of poly-Si and µc-Ge; a µc-SiGe layer; $(µc\text{-}Si)_{1-x}$ $(µc\text{-}Ge)_x$ layer; and $(poly\text{-}Si)_{1-x}$ $(µc\text{-}Ge)_x$ layer, wherein x varies with position; the third light absorption layer is an n-type µc-Ge layer.

Moreover, the front contact is a photosensitive material having a bandgap Eg1, the first light absorption layer is a photosensitive material having a bandgap Eg1, the first transition layer is a photosensitive material having a bandgap Eg2, the second light absorption layer is a photosensitive material having a bandgap Eg3, the second transition layer is a photosensitive material having a bandgap Eg4, the third light absorption layer is a photosensitive material having a bandgap Eg5, the back contact is a photosensitive material having a bandgap Eg5, wherein Eg1≥Eg2≥Eg3≥Eg4≥Eg5.

Furthermore, the superlattice layer of µc-Si and µc-Ge or the superlattice layer of poly-Si and µc-Ge is an n-type, p-type or i-type semiconductor, the configuration of which is defined as:

$$c_1 d_1/c_2 d_2/\ldots/c_i d_i/\ldots/c_n d_n$$

$c_i$: the thickness of a µc-Si or poly-Si layer with a bandgap Eg4$c$ in a ith unit, $d_i$: the thickness of a µc-Ge layer with a bandgap Eg4$d$ in the ith unit, the bandgap of the ith unit in the superlattice layer of µc-Si and µc-Ge or the superlattice layer of poly-Si and µc-Ge:

$$Eg4_i \approx Eg4c(c_i/(c_i+d_i)) + Eg4d(d_i/(c_i+d_i)),$$

$c_{i-1}=c_i$, $d_{i-1}=d_i$, i=1, 2, . . . , n, n=1~1000, i.e., Eg4 is a constant, and the thickness W2 of the superlattice layer of µc-Si and µc-Ge or the superlattice layer of poly-Si and µc-Ge is defined as: 0 nm<W2≤2.5 µm.

Moreover, the superlattice layer of µc-Si and µc-Ge or the superlattice layer of poly-Si and µc-Ge is an n-type, p-type or i-type semiconductor, the configuration of which is defined as:

$$c_1 d_1/c_2 d_2/\ldots/c_i d_i/\ldots/c_n d_n$$

$c_i$: the thickness of a µc-Si or poly-Si layer with a bandgap Eg4$c$ in a ith unit, $d_i$: the thickness of a µc-Ge layer with a bandgap Eg4$d$ in the ith unit, the bandgap of the ith unit in the superlattice layer of µc-Si and µc-Ge or the superlattice layer of poly-Si and µc-Ge:

$$Eg4_i \approx Eg4c(c_i/(c_i+d_i)) + Eg4d(d_i/(c_i+d_i)),$$

$c_{i-1}>c_i$, $d_{i-1}<d_i$, i=1, 2, . . . , n, n=1~1000, i.e., Eg4 is graded, and the thickness W2 of the superlattice layer of µc-Si and µc-Ge or the superlattice layer of poly-Si and µc-Ge is defined as: 0 nm<W2≤2.5 µm.

Furthermore, the units constituting the superlattice layer are formed by alternatively and repeatedly growing small bandgap material with a thickness being gradually increased and large bandgap material with a thickness being gradually decreased, the configuration of which is defined as $d_1c_1/d_2c_2/\ldots/d_ic_i/\ldots/d_nc_n$.

Moreover, the units constituting the superlattice layer are formed by alternatively and repeatedly growing a large bandgap material with a thickness being gradually decreased and a small bandgap material with a thickness being gradually increased, the configuration of which is defined as $c_1d_1/c_2d_2/\ldots/c_id_i/\ldots/c_nd_n$.

Furthermore, the μc-SiGe layer is an n-type, p-type or i-type semiconductor, the configuration of which is defined as:

$\mu c\text{-}Si_{1-x}Ge_x$ x is a constant and $0.01 \leq x \leq 1$, i.e., Eg4 is a constant, and the thickness W2 of the μc-SiGe layer is defined as: $0 \text{ nm} < W2 \leq 2.5 \text{ μm}$.

Moreover, the μc-SiGe layer is a modulated doping n-type, or p-type semiconductor, the configuration of which is defined as:

$a\text{-}Si_{1-x}Ge_x$ x is a function of position and $0.01 \leq x \leq 1$, i.e., Eg4 is graded, and the thickness W2 of the μc-SiGe layer is defined as: $0 \text{ nm} < W2 \leq 2.5 \text{ μm}$.

Furthermore, the mixed layer of μc-Si and μc-Ge or the mixed layer of poly-Si and μc-Ge is an n-type, p-type or i-type semiconductor, the configuration of which is defined as:

$(\mu c\text{-}Si)_{1-x}(\mu c\text{-}Ge)_x$ $(poly\text{-}Si)_{1-x}(\mu c\text{-}Ge)_x$ x is a constant and $0.01 \leq x \leq 1$, i.e., Eg4 is a constant, and the thickness W2 of the mixed layer of μc-Si and μc-Ge or the mixed layer of poly-Si and μc-Ge is as defined: $0 \text{ nm} < W1 \leq 2.5 \text{ μm}$, wherein hydrogen content in a process gas is adjusted during film formation to change the x value.

Moreover, the $(\mu c\text{-}Si)_{1-x}(\mu c\text{-}Ge)_x$ layer or the $(poly\text{-}Si)_{1-x}(\mu c\text{-}Ge)_x$ layer is a (an) n-type, p-type or i-type semiconductor, the configuration of which is defined as:

$(\mu c\text{-}Si)_{1-x}(\mu c\text{-}Ge)_x$ $(poly\text{-}Si)_{i-x}(\mu c\text{-}Ge)_x$ x is a function of position and $0.01 \leq x \leq 1$, i.e., Eg4 is graded, and the thickness W2 of the $(\mu c\text{-}Si)_{1-x}(\mu c\text{-}Ge)_x$ layer or the $(poly\text{-}Si)_{1-x}(\mu c\text{-}Ge)_x$ layer is as follows: $0 \text{ nm} < W2 \leq 2.5 \text{ μm}$, wherein hydrogen content in a process gas is continuously adjusted during film formation to make the x value vary with position.

Furthermore, the above solar cell further comprises: an a-SiO:H (hydrogenated a-SiO) layer, located between the front contact and the first light absorption layer. The a-SiO:H layer having a graded bandgap is formed by introducing oxygen to the chamber of a film forming device after growing a $p^+$-type a-Si layer and making oxygen content in the atmosphere of the chamber be 0~20%. Since the bandgap of the a-SiO:H layer is about 2.0 eV, larger than that of a-Si (Eg=1.7 eV), the built-in electric field of the solar cell can be enhanced to speed the collection of carriers.

A thin-film solar cell according to the third aspect of the present invention comprises: a first electrode; a front contact, formed on the first electrode; a first light absorption layer, formed on the front contact; a second light absorption layer, formed on the first light absorption layer; a third light absorption layer, formed on the second light absorption layer; a fourth light absorption layer, formed on the third light absorption layer, a back contact, formed on the fourth light absorption layer; and a second electrode, formed on the back contact, wherein the first electrode is made of a transparent conductive oxide layer; the front contact is made of $p^+$-type a-Si; the first light absorption layer is made of a-Si gradually varied into a-SiO:H; the second light absorption layer is made of a-SiO:H gradually varied into a-Si; the third light absorption layer 508 is made of a-Si gradually varied into μc-Si or a-Si gradually varied into poly-Si; the fourth light absorption layer is made of μc-Si gradually varied into a-Si or poly-Si gradually varied into a-Si; the back contact 512 is made of $n^+$-type a-Si; and the second electrode 514 is made of a transparent conductive oxide layer, Ag, or Al.

Furthermore, in the thin-film solar cell according to the third aspect of the present invention, the front contact may be formed of $n^+$-type a-Si and the back contact may be formed of $p^+$-type a-Si.

Moreover, the thin-film solar cell according to the third aspect of the present invention can further have a reflecting layer made of a-SiO$_x$:H(x=0~0.3) disposed between the back contact and the second electrode. Light utilization efficiency is enhanced by making light incident to the reflecting layer generate multiple reflections.

Furthermore, the above solar cell further comprises: one or more row(s) of nano-particles, the nano-particles disposed in any layer of the thin-film solar cell. Preferably, the nano-particles have at least two different bandgaps and/or reflex indexes.

Moreover, the material of the nano-particles is one selected from a group consisting of Si, Ge, metals, materials having different dielectric constants from $SiO_2$, and composite materials thereof.

Furthermore, the size of the nano-particles ranges from 1 nm to 100 nm.

By doing so, electrons are accelerated in the thin-film solar cell through graded structure, which is so configured that a-SiO:H is gradually varied into a-Si and gradually varied into μc-Si, and efficiently collected, thereby enhancing photocurrent. As compared with $n^+$-type μc-Si/TCO, a leakage current is reduced and an open-circuit voltage (Voc) is increased by means of $n^+$-type a-Si/TCO, thereby efficiently increasing efficiency.

The present invention provides a method of manufacturing the thin-film solar cell according to the aspects above, in which a film forming system selected from a group consisting of a high density plasma chemical vapor deposition (HD-PCVD) system, a plasma enhanced chemical vapor deposition (PECVD) system, a metal organic chemical vapor deposition (MOCVD) System, a molecular beam epitaxy (MBE) system, an ultra-high vacuum chemical vapor deposition (UHVCVD) system, an atomic layer deposition (ALD) system, and photo chemical vapor deposition (Photo-CVD) is used to form individual layers having different crystalline phases, different doping, and different thicknesses.

The above thin-films having different crystalline phases are formed by controlling the flow rate of hydrogen during film formation to adjust crystallinity thereof. For example, in the case that a structure with a large bandgap layer gradually varied into a small bandgap layer (such as a-Si gradually varied into μc-Si) is formed, an a-Si layer having crystallinity of 0% is gradually varied into a μc-Si layer having crystallinity of 60~100% by controlling the flow rate of hydrogen during film formation.

The Effect of the Invention

According to the solar cell of the present invention, since Si and Ge elements which are rich in the earth and have no harm to environments are used as raw materials, the problems of such as high manufacturing costs of compound semiconductor (for example, CIGS or CdTe) solar cells and environmental pollution are prevented. Therefore, it is referred to as a new green energy solar cell.

The conversion efficiency of the prior solar cell using a p/i/n structure is about 7%. Although the conversion efficiency of a current mainstream solar cell having a p/i/n/TCO/p/i/n structure can reach 14% or more in theory, due to carrier recombination easily caused by resistances existing in each layer of n/TCO/p and junctions between them and the factors, such as transmittance, resistance and refraction index of the TCO itself, the conversion efficiency is only about 8% in practice.

BRIEF DESCRIPTION OF THE DRAWINGS

FIG. 3E is a schematic view showing two first arrays in tandem according to the embodiment 3E of the present invention.

FIG. 5 is a schematic view showing the bandgap of the transition layer of the tandem solar cell showing in FIG. 3.

FIG. 8 is a schematic view showing the bandgap of the second transition layer of the tandem solar cell showing in FIG. 6.

DESCRIPTION OF THE PREFERRED EMBODIMENTS

Hereinafter, the embodiments of the thin-film solar cell of the present invention are described with reference to the accompanying drawings.

First Embodiment

Figure 1:
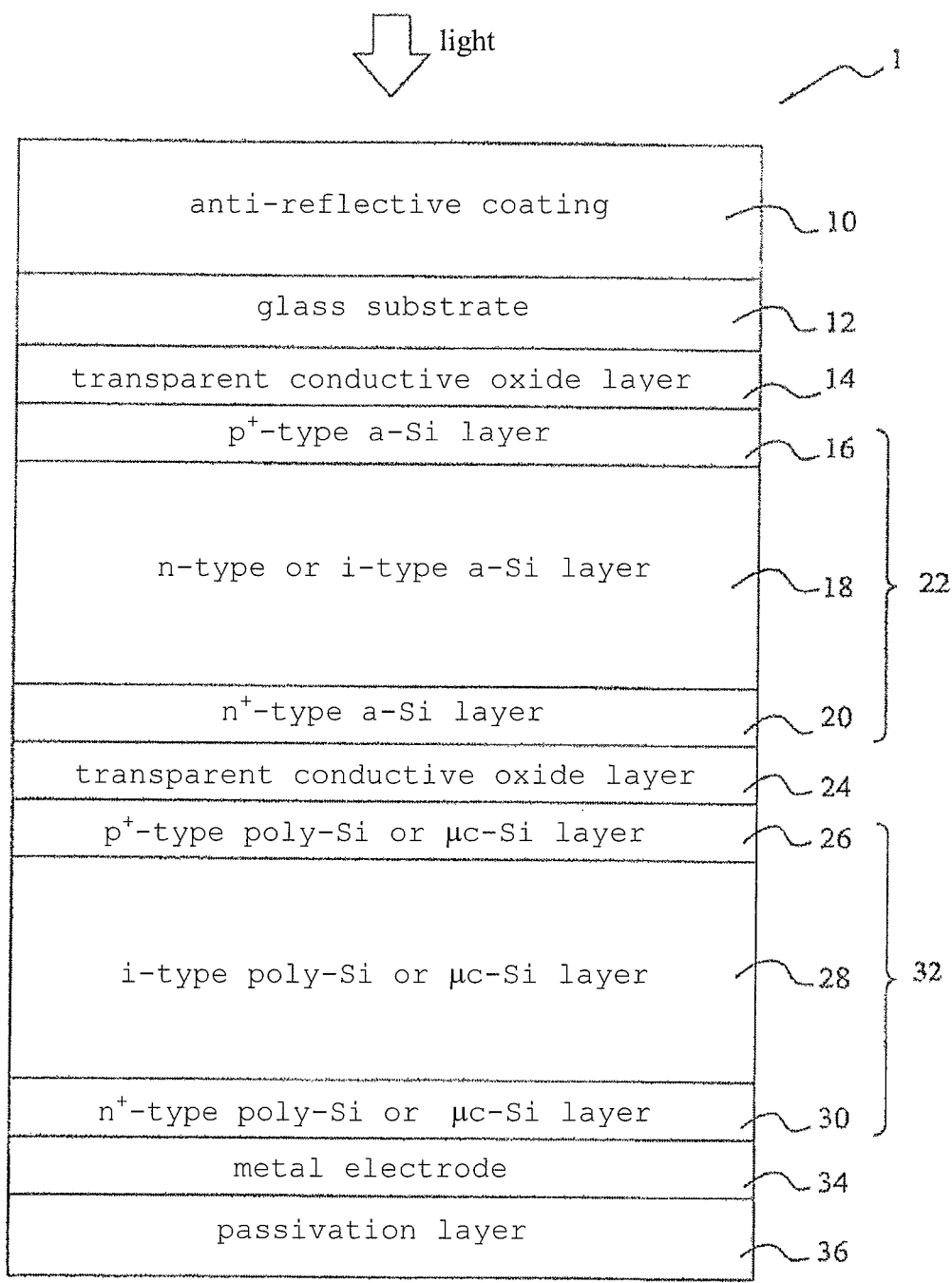
FIG. 1 is a schematic view showing the structure of an a-Si/TCO/c-Si tandem solar cell having a p-i-n junction in the prior art.
Figure 2:
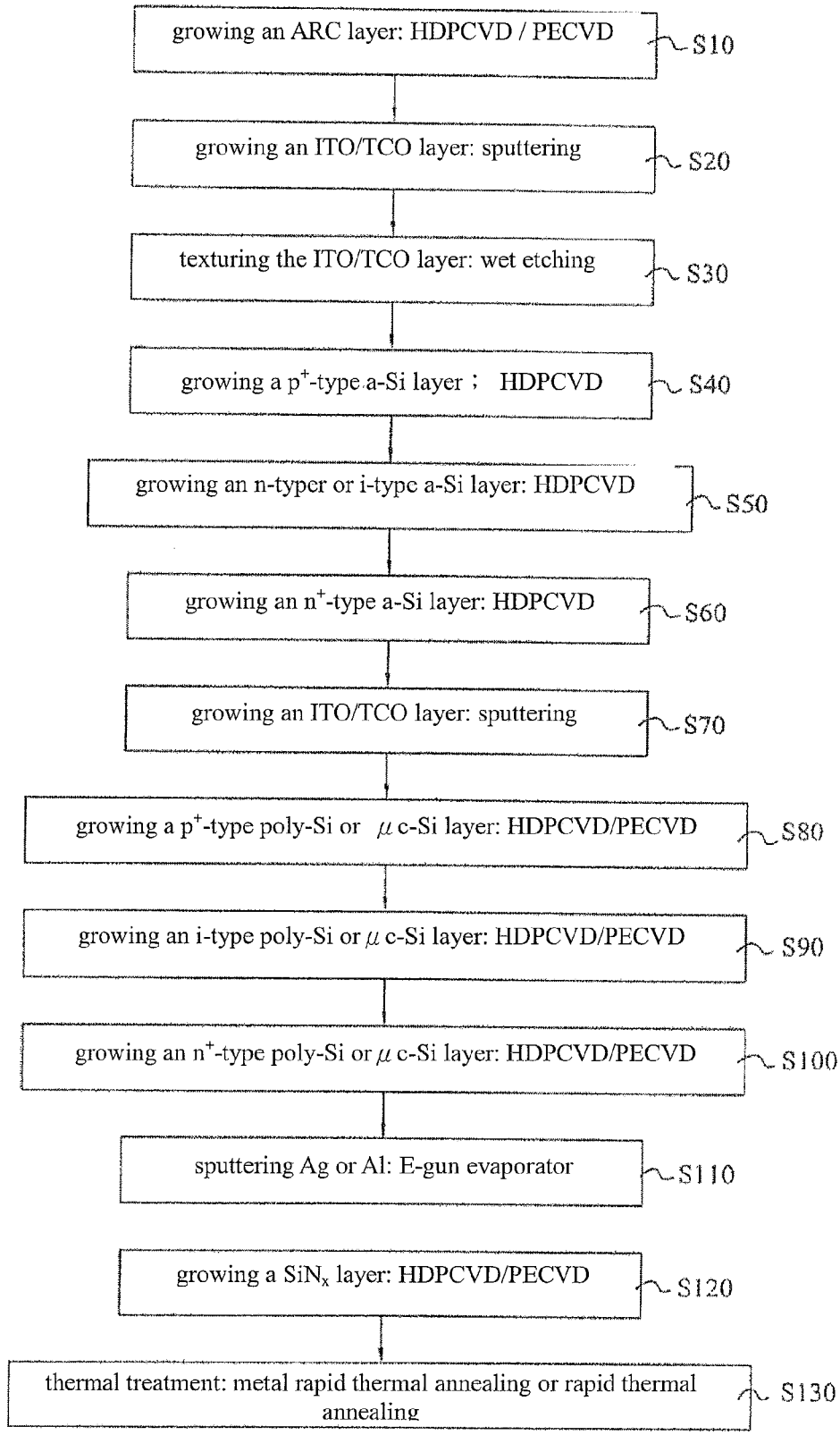
FIG. 2 is a flow chart of manufacturing the a-Si/TCO/c-Si tandem solar cell having a p-i-n junction shown in FIG. 1.
Figure 3:
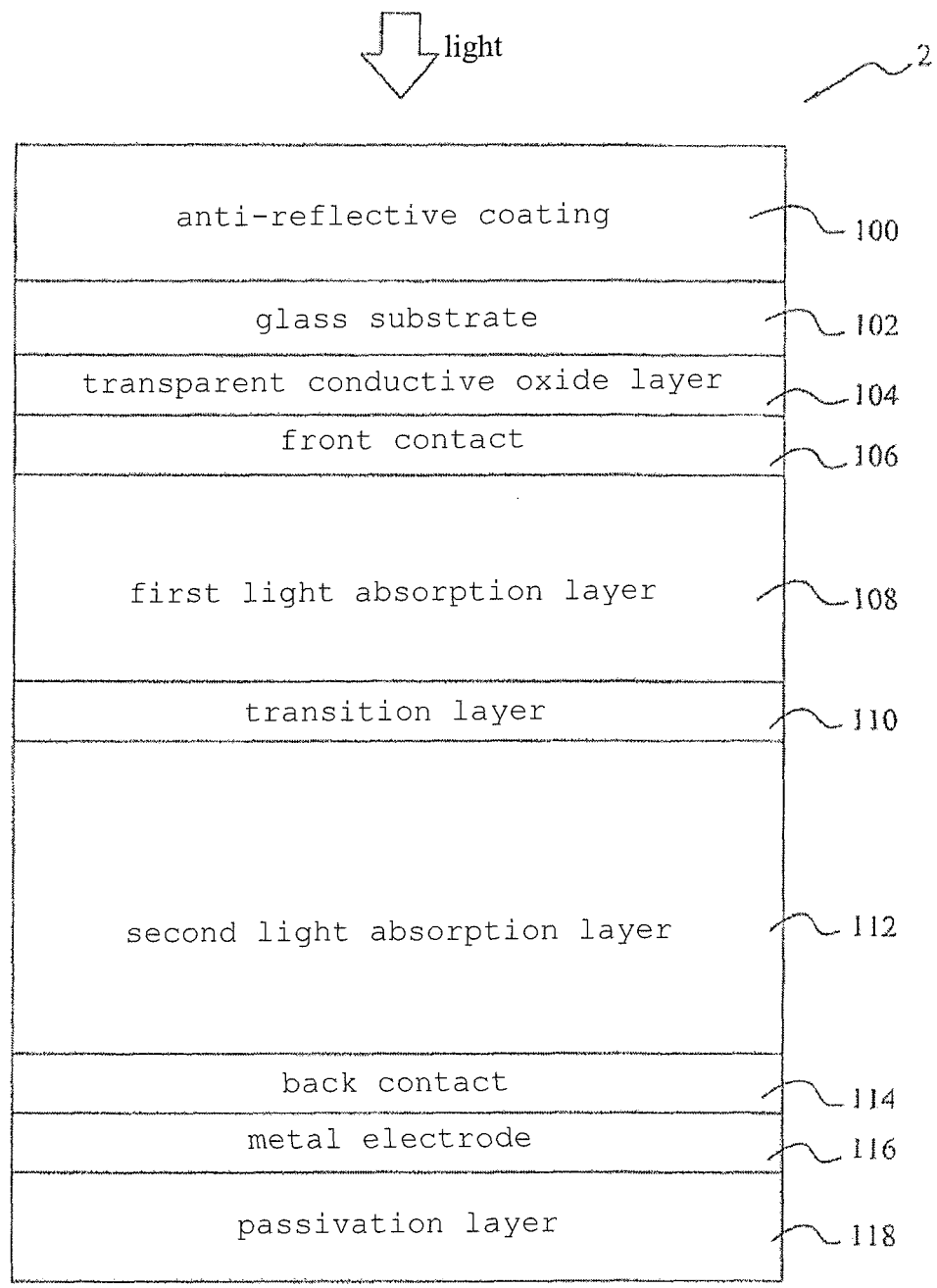
FIG. 3 is a schematic view showing a tandem solar cell having a structure of a first light absorption layer, a transition layer, a second light absorption layer according to the present invention.

Referring to FIG. 3, a thin-film solar cell according to the first aspect of the present invention comprises: a front contact 106; a first light absorption layer 108, formed on the front contact 106; a transition layer 110, formed on the first light absorption layer 108; a second light absorption layer 112, formed on the transition layer 110; and a back contact 114, formed on the second light absorption layer 112.

A tandem solar cell 2 having an a-Si (first light absorption layer 108)/a-SiGe (transition layer 110)/c-Si (second light absorption layer 112) structure shown in FIG. 3 is manufactured. FIG. 5 is a schematic view showing the bandgap of the transition layer of the tandem solar cell showing in FIG. 3.

First, an anti-reflective coating 100, such as silicon oxynitride, silicon nitride, or silicon oxynitride/silicon nitride, is deposited on a glass substrate 102 by HDPCVD or PECVD. A transparent conductive oxide layer 104, such as ITO or $SnO_2$/ZnO, is grown by sputtering, and then the transparent conductive oxide layer 104 is textured by etching.

The substrate is transferred into a film forming system selected from a group consisting of HDPCVD, PECVD, MOCVD, MBE, UHVCVD, ALD, and photo chemical vapor deposition (photo-CVD) systems, and various process gases of nitrogen ($N_2$), argon (Ar), silane ($SiH_4$), germane ($GeH_4$) and the like are introduced to deposit Si(Ge) films. Accordingly, $p^+$-type a-Si, i-type a-Si, a-SiGe, n-type μc-Si, and $n^+$-type μc-Si films having different crystalline phases, different doping, and different thicknesses are formed by adjusting film forming process parameters of temperature, pressure, gas flow rate and the like, so as to function as a front contact 106, a first light absorption layer 108, a transition layer 110, a second light absorption layer 112, and a back contact 114, respectively. For the deposition of a-SiGe, generally, $SiH_4$ with a stable flow rate is first introduced, and then $GeH_4$ is slowly introduced to modify Ge content in a SiGe film, so as to form an a-SiGe junction buffer.

Then, a metal electrode 116 is formed by sputtering textured transparent conductive oxide, Ag or Al using an E-gun evaporator. Next, silicon nitride or silicon dioxide is grown as a passivation layer 118 by HDPCVD or PECVD. Finally, a thermal treatment to the films are performed by RTA.

Second Embodiment

A tandem solar cell 2 having an a-Si (first light absorption layer 108)/superlattice (a-Si/μc-Si, transition layer 110)/μc-Si (second light absorption layer 112) structure shown in FIG. 3 is manufactured.

Except for a process of determining the number of units of superlattice according to Eg* and total thickness required by the transition layer, the other processes are the same as those of the first embodiment, wherein it is defined that a single unit of the superlattice consists of one a-Si and one μc-Si and its bandgap is Eg*.

Example 1: bandgap is constant, and the thicknesses of a-Si and μc-Si in the unit are the same.

let $a_i$: the thickness of the a-Si layer and $b_i$: the thickness of the μc-Si layer, i=1, 2, . . . , n; n=1~1000,
set $a_i$: $b_i$=1:1, 1 nm<$a_i$, $b_i$<10 nm
$Eg^*_1 = Eg^*_2 = Eg^*_3 = \ldots$
$(a\text{-}Si)_x(\mu c\text{-}Si)_y$: $Eg^* = 1.7x + 1.1y$
$x = a_i/(a_i+b_i)$
$y = b_i/(a_i+b_i)$ For example, if it is given that Eg*=1.4 eV, and $a_i:b_i$=1:1, then (x, y)=(0.5, 0.5).

Next, if it is given that $a_i$ is 1 nm, then the thickness of the single unit is 2 nm. If it is given that the total thickness <100 nm, then the transition layer consists of about 50 units.

Example 2: bandgap is constant, and the thicknesses of a-Si and μc-Si in the unit are different.

1.2 eV<Eg*<1.6 eV let $a_i$: the thickness of the a-Si layer and $b_i$: the thickness of the μc-Si layer, i=1, 2, . . . , n; n=1~1000,
set $a_i$: $b_i$=x:y; 0<x, y<1; 1 nm<$a_i$, $b_i$<10 nm
$Eg^*_1 = Eg^*_2 = Eg^*_3 = \ldots$
$(a\text{-}Si)_x(\mu c\text{-}Si)_y$: $Eg^* = 1.7x + 1.1y$
$x = a_i/(a_i+b_i)$
$y = b_i/(a_i+b_i)$ For example, if it is given that Eg*=1.5 eV, and the total thickness of the transition layer<100 nm, then Eg*=1.7x+1.1y, and 0<x, y<1.

A set of solution (x, y)=(0.3, 0.9) can be selected.

Also, since ai:bi=x:y, if it is set that $a_i$=1 nm, $b_i$=3 nm, the single unit (ai, bi)=(1 nm, 3 nm).

If it is given that the total thickness <100 nm, then transition layer consists of about 25 units.

Example 3: graded bandgap
1.2 eV<Eg*<1.6 eV let $a_i$: the thickness of the a-Si layer and $b_i$: the thickness of the μc-Si layer, i=1, 2, . . . , n; n=1~1000,
set $a_i$: $b_i$=x:y; 0<x, y<1; 1 nm<$a_i$, $b_i$<10 nm
if the unit number n is given and if $Eg^*_1 > Eg^*_2 > Eg^*_3 > \ldots$, then $(a\text{-}Si)_x(\mu c\text{-}Si)_y$: $Eg^* = 1.7x + 1.1y$.

$x = a_i/(a_i+b_i)$
$y = b_i/(a_i+b_i)$

The present invention further provides six kinds of graded bandgap embodiments.

In FIGS. 3A-3F, the horizontal direct indicates the thickness or the film formation direction, and the vertical direct indicates the variation of bandgap. It is noted that the FIGS. 3A-3F are schematically illustrated and not drawn to scale.

Figure 3A:
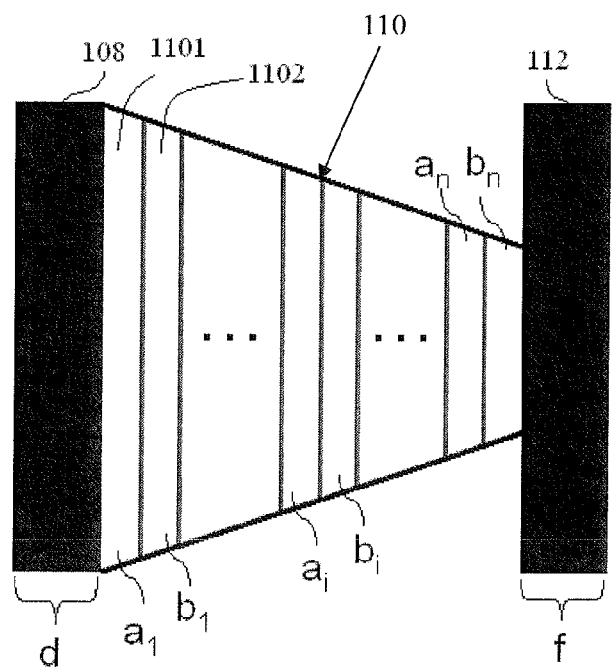
FIG. 3A is a schematic view showing a structure of the first light absorption layer, the transition layer and the second light absorption layer according to the embodiment 3A of the present invention.

The first graded bandgap embodiment 3A is described with reference to FIG. 3A, and that shows a first light absorption layer 108, a transition layer 110 and a second light absorption layer 112, wherein the first light absorption layer 108 is made of a photosensitive material with a first bandgap Eg1; the second light absorption layer 112 is made of a photosensitive material with a third bandgap Eg3; and the transition layer 110 comprises of a plurality of first superlattice layers 1101 and a plurality of second superlattice layers 1102. The plurality of first superlattice layers 1101 are made of a photosensitive material with the first bandgap Eg1, the plurality of second superlattice layers 1102 are made of a photosensitive material with the second bandgap Eg2. The first bandgap Eg1 is larger than the second bandgap Eg2. In addition, each one of the first superlattice layers 1101 is alternated with each one of the second superlattice layers 1102 in a tandem arrangement, and the graded bandgap of the transition layer 110 is formed by varying a thicknesses of at least one of the first superlattice layer 1101 and the second superlattice layer 1102.

In the embodiment 3A, the thickness of each one of the first superlattice layers 1101 is gradually thinned towards the second light absorption layer 112, the thickness of each one of the second superlattice layers 1102 is gradually thickened towards the second light absorption layer 112, so that the graded bandgap of the transition layer 110 which is decreasing is gained. Specifically, FIG. 3A shows that the first light absorption layer 108 with a thickness d at the beginning, and the second light absorption layer 112 with a thickness f at the end, and the plurality of first superlattice layers 1101 and the plurality of second superlattice layers 1102 are arranged between the first light absorption layer 108 and the second light absorption layer 112. Each one of the first superlattice layers 1101 is alternated with each one of the second superlattice layers 1102 in a tandem arrangement, which is expressed as $a_1b_1/\ldots/a_ib_i/\ldots/a_nb_n$, in which $a_i$ represents the thickness of the $i_{th}$ layer of the first superlattice layers 1101, and $b_i$ represents the thickness of the $i_{th}$ layer of the second superlattice layers 1102, i=1, 2, . . . , n (n is an integer); $a_i > a_{i+1}$ and $b_i < b_{i+1}$.

Figure 3B:
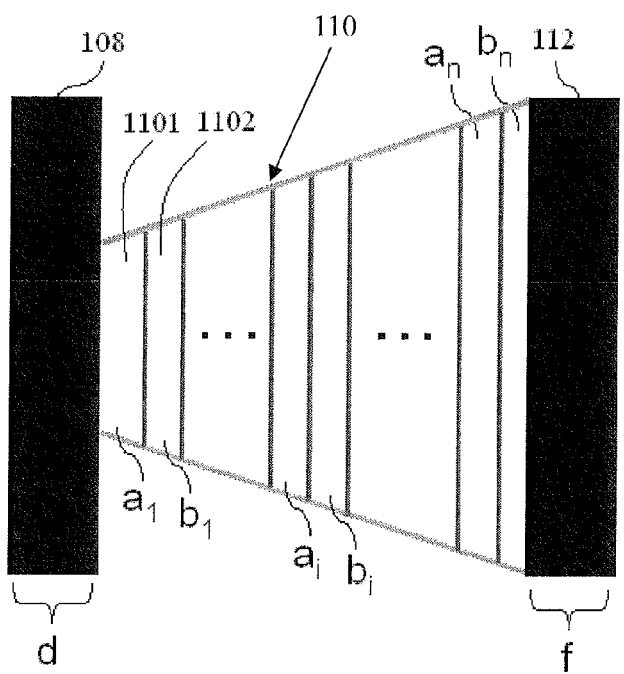
FIG. 3B is a schematic view showing a structure of the first light absorption layer, the transition layer and the second light absorption layer according to the embodiment 3B of the present invention.

The second graded bandgap embodiment 3B is described with reference to FIG. 3B. The thickness of each first superlattice layer 1101 is gradually thickened towards the second light absorption layer 112, the thickness of each second superlattice layer 1102 is gradually thinned towards the second light absorption layer 112, so that a graded bandgap of the transition layer which is decreased is gained. Specifically, FIG. 3B shows that the first light absorption layer 108 with a thickness d at the beginning, and the second light absorption layer 112 with a thickness f at the end, and the plurality of first superlattice layers 1101 and the plurality of second superlattice layers 1102 are arranged between the first light absorption layer 108 and the second light absorption layer 112. Each one of the first superlattice layers 1101 is alternated with each one of the second superlattice layers 1102 in a tandem arrangement, which is expressed as $a_1b_1/\ldots/a_ib_i/\ldots/a_nb_n$, in which $a_i$ represents the thickness of the $i_{th}$ layer of the first superlattice layers 1101, and $b_i$ represents the thickness of the $i_{th}$ layer of the second superlattice layers 1102, i=1, 2, ..., n (n is a integer); $a_i < a_{i+1}$ and $b_i > b_{i+1}$.

The third graded bandgap embodiment 3C is described with reference to FIG. 3C. The thickness of each first superlattice layer 1101 is gradually thinned from an initial thickness $a_1$ to a specific thickness $a_n$, and then gradually thickened to the initial thickness $a_1$; the thickness of each second superlattice layer 1102 is gradually thickened from an initial thickness $b_1$ to a specific thickness $b_n$, and then gradually thinned to the initial thickness $b_1$, so that a graded bandgap of the transition layer 110 which is decreased and then increased is gained.

Figure 3C:
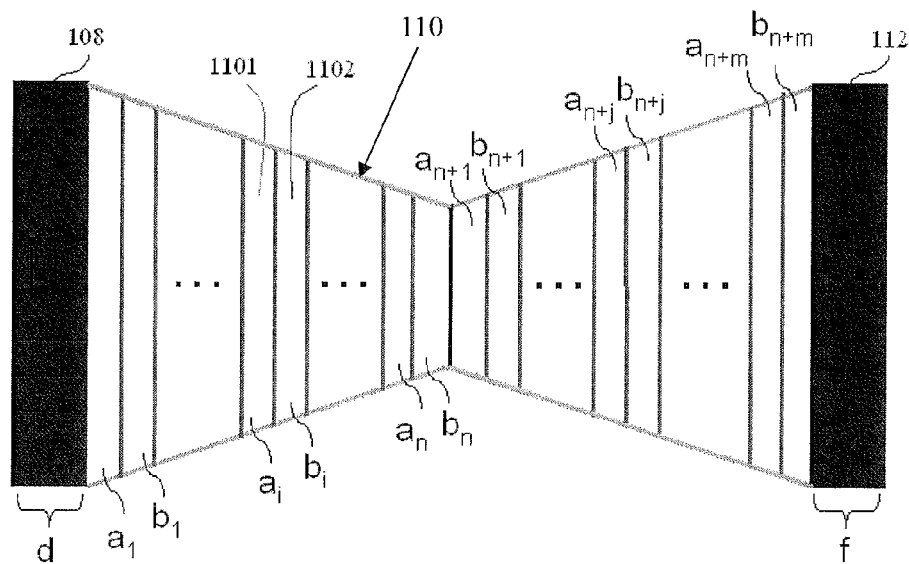
FIG. 3C is a schematic view showing a structure of the first light absorption layer, the transition layer and the second light absorption layer according to the embodiment 3C of the present invention.

Specifically, FIG. 3C shows that the first light absorption layer 108 with a thickness d at the beginning, and the second light absorption layer 112 with a thickness f at the end, and the plurality of first superlattice layers 1101 and the plurality of second superlattice layers 1102 are arranged between the first light absorption layer 108 and the second light absorption layer 112. Each one of the first superlattice layers 1101 is alternated with each one of the second superlattice layers 1102 in a tandem arrangement, which is expressed as $a_1b_1/ \ldots /a_ib_i/ \ldots /a_nb_n/a_{n+1}b_{n+1}/ \ldots /a_{n+j}b_{n+j}/ \ldots /a_{n+m}b_{n+m}$, in which $a_i$ represents the thickness of the $i_{th}$ layer of the first superlattice layers 1101, and $b_i$ represents the thickness of the $i_{th}$ layer of the second superlattice layers 1102, i=1, 2, ..., n (n is an integer); j=1, 2, ..., m (m is an integer); $a_i > a_{i+1}$ and $b_i < b_{i+1}$; $a_{n+j} < a_{n+j+1}$ and $b_{n+j} > b_{n+j+1}$. However, the thickness $a_{n+m}$ of the last layer of the first superlattice layers 1101 is equal to the thickness $a_1$; the thickness $b_{n+m}$ of the last layer of the second superlattice layers 1102 is equal to the thickness $b_1$.

The fourth graded bandgap embodiment 3D is described with reference to FIG. 3D. The thickness of each first superlattice layer 1101 is gradually thickened from an initial thickness $a_1$ to a specific thickness $a_n$, and then gradually thinned to the initial thickness $a_1$; the thickness of each second superlattice layer 1102 is gradually thinned from an initial thickness $b_1$ to a specific thickness $b_n$, and then gradually thickened to the initial thickness $b_1$, so that a graded bandgap of the transition layer 110 which is increased first and then decreased is gained.

Figure 3D:
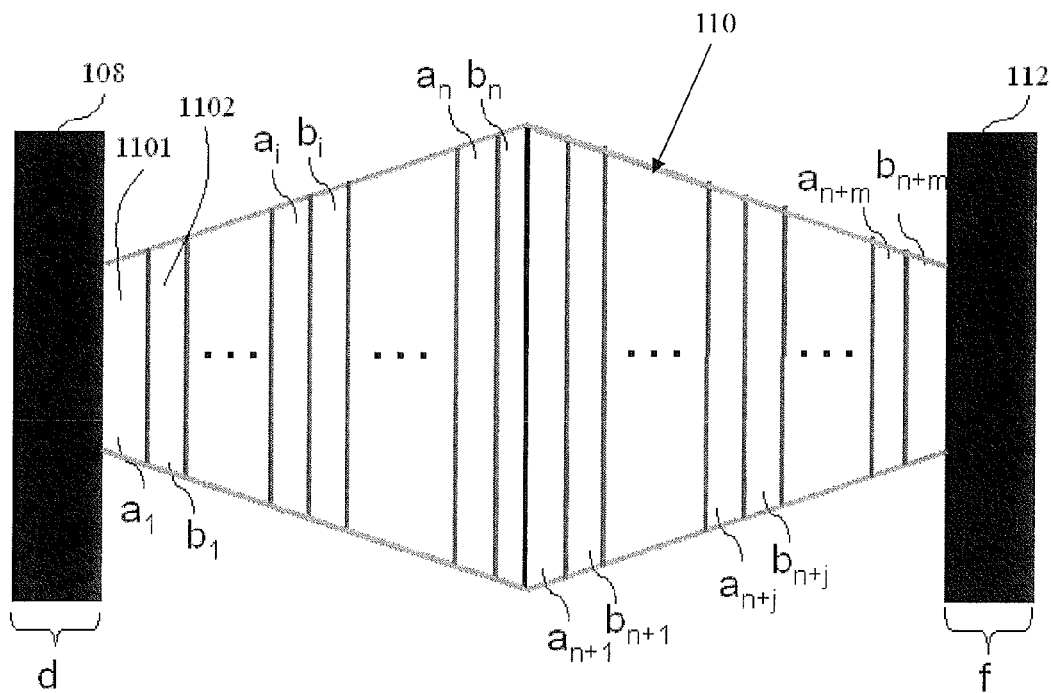
FIG. 3D is a schematic view showing a structure of the first light absorption layer, the transition layer and the second light absorption layer according to the embodiment 3D of the present invention.

Specifically, FIG. 3D shows that the first light absorption layer 108 with a thickness d at the beginning, and the second light absorption layer 112 with a thickness f at the end, and the plurality of first superlattice layers 1101 and the plurality of second superlattice layers 1102 are arranged between the first light absorption layer 108 and the second light absorption layer 112. Each one of the first superlattice layers 1101 is alternated with each one of the second superlattice layers 1102 in tandem, which is expressed as $a_1b_1/ \ldots /a_ib_i/ \ldots /a_nb_n/a_{n+1}b_{n+1}/ \ldots /a_{n+j}b_{n+j}/ \ldots /a_{n+m}b_{n+m}$, in which $a_i$ represents the thickness of the $i_{th}$ layer of the first superlattice layers 1101, and $b_i$ represents the thickness of the $i_{th}$ layer of the second superlattice layers 1102, i=1, 2, ..., n (n is an integer); j=1, 2, ..., m (m is an integer); $a_i < a_{i+1}$ and $b_i > b_{i+1}$; $a_{n+j} > a_{n+j+1}$ and $b_{n+j} < b_{n+j+1}$. However, the thickness $a_{n+m}$ of the last layer of the first superlattice layers 1101 is equal to the thickness $a_1$; the thickness $b_{n+m}$ of the last layer of the second superlattice layers 1102 is equal to the thickness $b_1$.

Figure 3F:
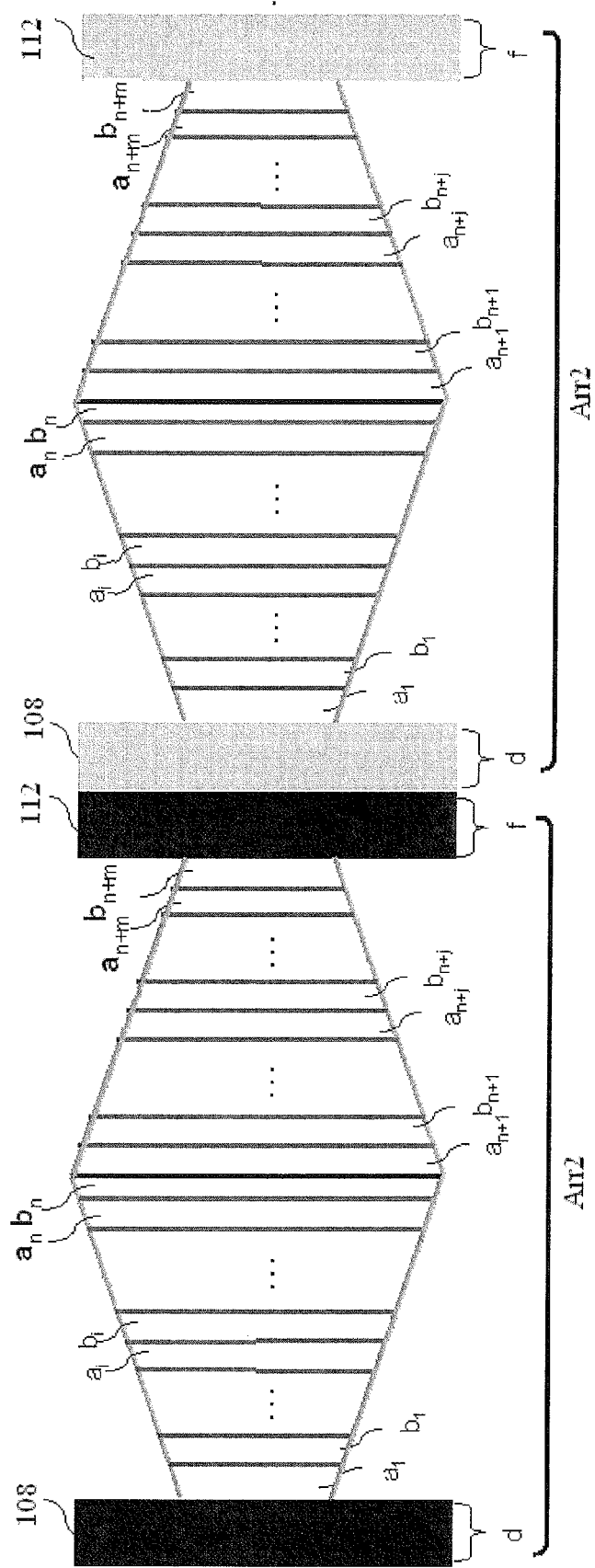
FIG. 3F is a schematic view showing two second arrays in tandem according to the embodiment 3F of the present invention.

The fifth graded bandgap embodiment 3E and the sixth graded bandgap embodiment 3F are described with reference to FIG. 3E and FIG. 3F. Two first arrays Arr1 are connected in tandem.

As mentioned in the embodiment 3C, each of the first array Arr1 consists of the first light absorption layer 108, the transition layer 110 and the second light absorption layer 112. Similarly, two second arrays Arr2, as mentioned in the embodiment 3D, are connected in tandem. Based on these two embodiments, a skilled person could tandem two or more arrays to achieve a better photo-electric conversion efficiency.

Third Embodiment

Figure 9:
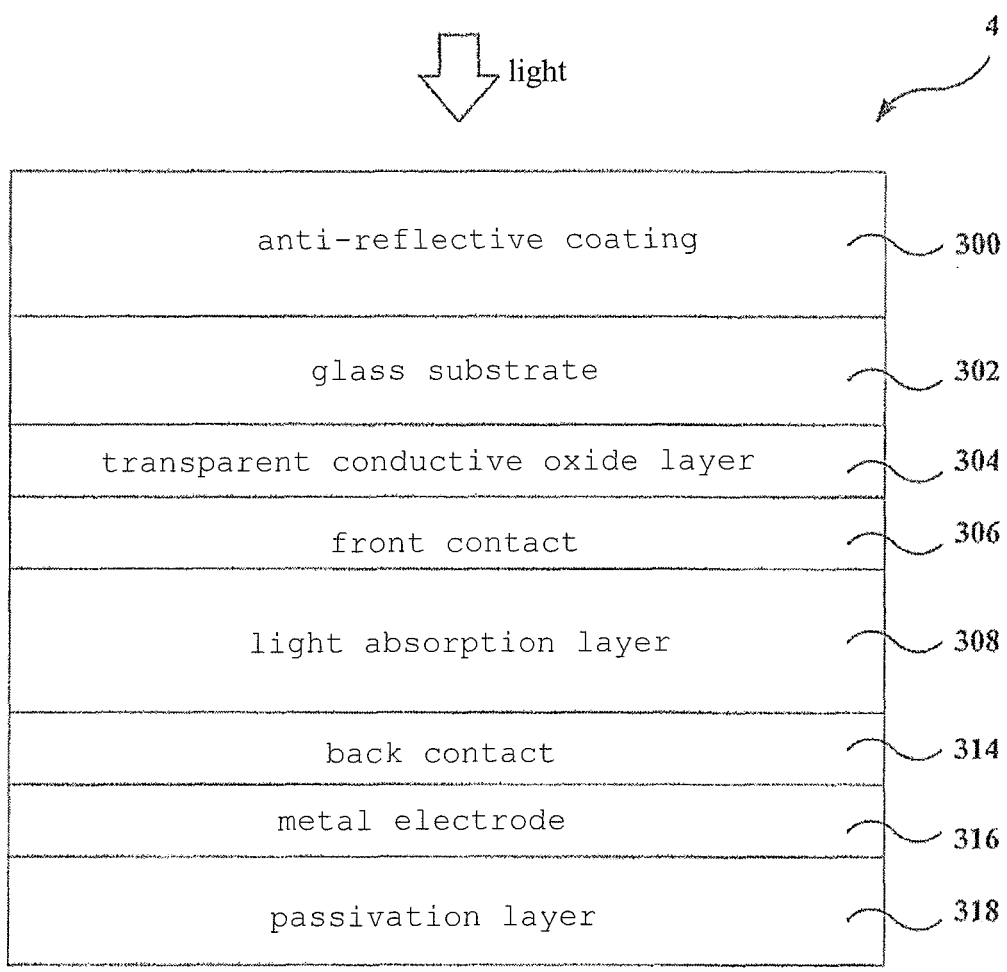
FIG. 9 is a schematic view showing a structure of a solar cell using a superlattice layer as a light absorption layer, of the present invention.
Figure 10:
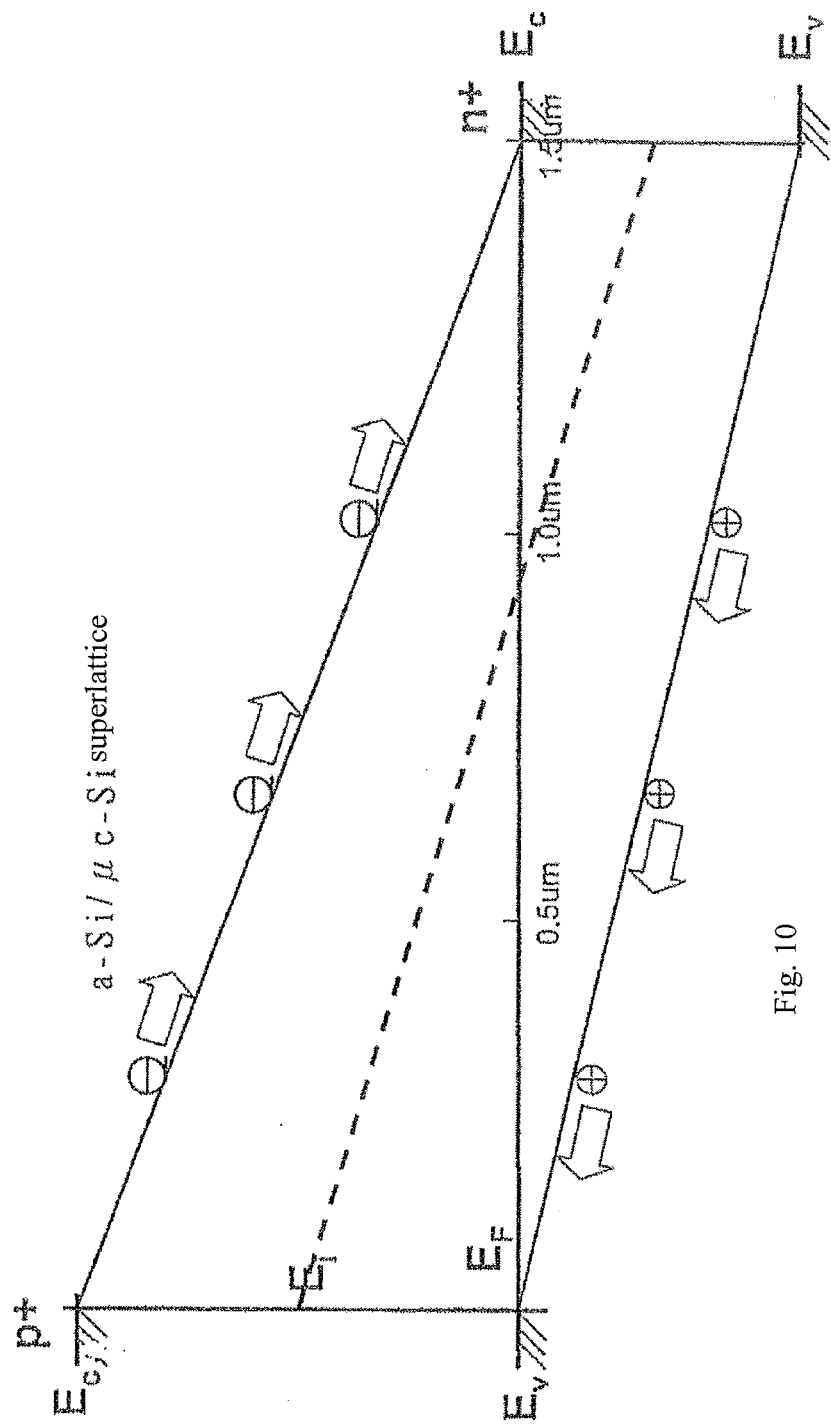
FIG. 10 is a schematic view showing the fully graded bandgap of the solar cell shown in FIG. 9.

A tandem solar cell 4 having a graded superlattice layer as a light absorption layer 308 (shown in FIG. 9) instead of the a-Si (first light absorption layer 108)/a-SiGe (transition layer 110)/c-Si (second light absorption layer 112) structure is manufactured. FIG. 10 is a schematic view showing the fully graded bandgap of the solar cell shown in FIG. 9, wherein abscissa represents thickness.

First, an anti-reflective coating 300, such as silicon oxynitride, silicon nitride, or silicon oxynitride/silicon nitride, is deposited on a glass substrate 302 by HDPCVD or PECVD. A transparent conductive oxide layer 304, such as ITO or $SnO_2$/ZnO, is grown by sputtering, and then the transparent conductive oxide layer 304 is textured by etching.

The substrate is sent into a film forming system selected from a group consisting of HDPCVD, PECVD, MOCVD, MBE, UHVCVD, ALD, and photo chemical vapor deposition systems, and various process gases of nitrogen ($N_2$), argon (Ar), silane ($SiH_4$) and the like are introduced to deposit Si films. Accordingly, $p^+$-type a-Si, a-Si/μc-Si superlattice, and $n^+$-type μc-Si films having different crystalline phases, different doping, and different thicknesses are formed by adjusting film forming process parameters of temperature, pressure, gas flow rate and the like, so as to function as a front contact 306, a light absorption layer 308, and a back contact 314, respectively, wherein the configuration of the superlattice layer is determined by the process described in Example 3 of the second embodiment.

Then, a metal electrode 316 is formed by sputtering textured transparent conductive oxide, Ag or Al using an E-gun evaporator. Next, silicon nitride or silicon dioxide is grown as a passivation layer 318 by HDPCVD or PECVD. Finally, a terminal treatment to the films are performed by RTA.

Fourth Embodiment

Figure 6:
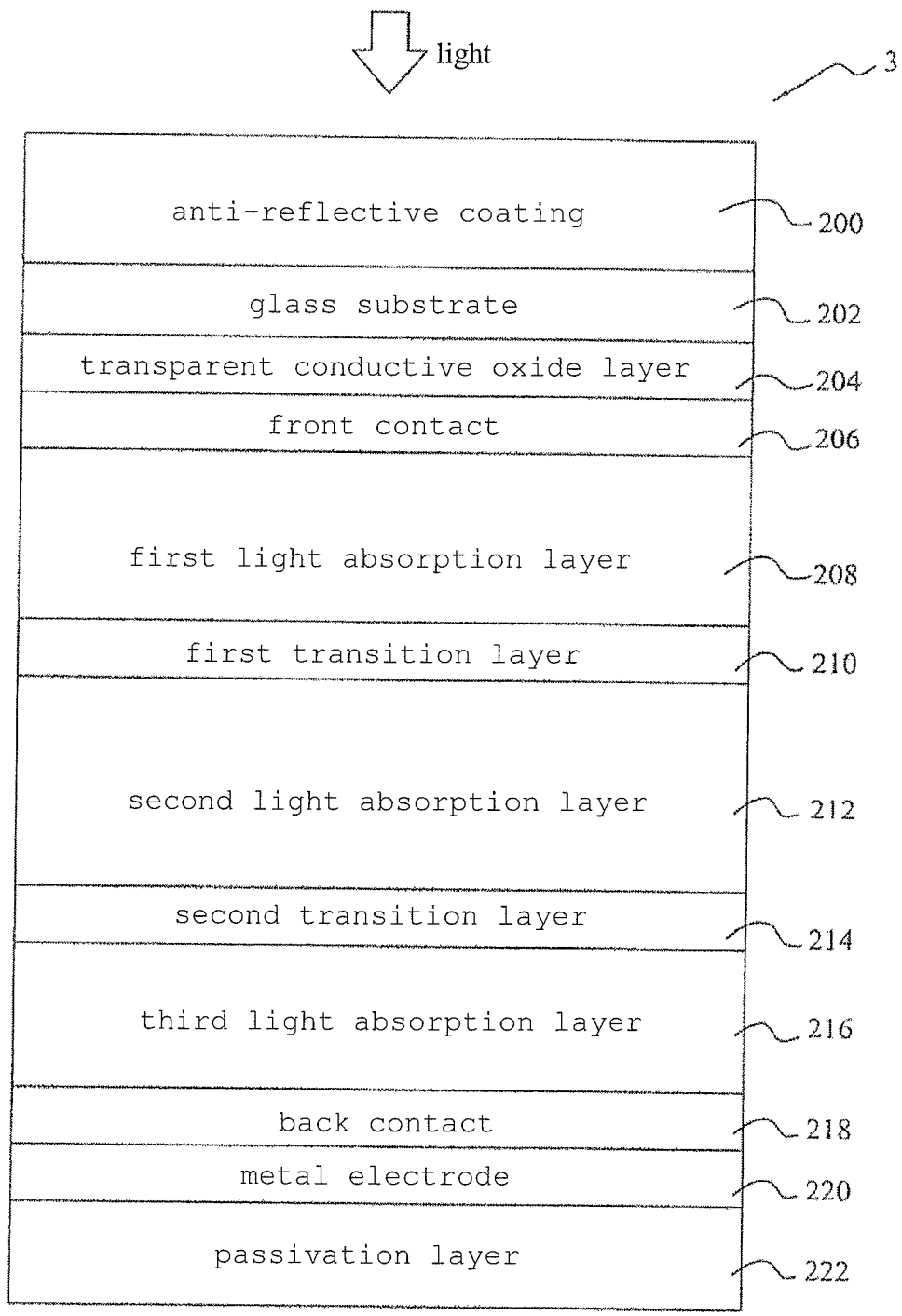
FIG. 6 is a schematic view showing a structure of a tandem solar cell having a first light absorption layer, a first transition layer, a second light absorption layer, a second transition layer and a third light absorption layer according to the present invention.

Referring to FIG. 6, a thin-film solar cell according to the second aspect of the present invention comprises:

a front contact 206, having a bandgap Eg1;

a first light absorption layer 208, formed on the front contact 206 and having a bandgap Eg1;

a first transition layer 210, formed on the first light absorption layer 208 and having a bandgap Eg2;

a second light absorption layer 212, formed on the first transition layer 210 and having a bandgap Eg3;

a second transition layer 214, formed on the second light absorption layer 212 and having a bandgap Eg4;

a third light absorption layer 216, formed on the second transition layer 214 and having a bandgap Eg5; and a back contact 218, formed on the third light absorption layer 216 and having a bandgap Eg5, wherein the configuration and definition of the first transition layer 210 are the same as those of the transition layer 110.

A tandem solar cell 3 having an a-Si (first light absorption layer 208)/a-SiGe (first transition layer 210)/μc-Si (second light absorption layer 212)/μc-SiGe (second transition layer 214)/μc-Ge (third light absorption layer 216) structure shown in FIG. 6 is manufactured. FIG. 8 is a schematic view showing the bandgap of the second transition layer of the tandem solar cell showing in FIG. 6.

First, an anti-reflective coating 200, such as silicon oxynitride, silicon nitride, or silicon oxynitride/silicon nitride, is deposited on a glass substrate 202 by HDPCVD or PECVD. A transparent conductive oxide layer 204, such as ITO or SnO$_2$/ZnO, is grown by sputtering, and then the transparent conductive oxide layer 204 is textured by etching.

The substrate is sent into a film forming system selected from a group consisting of HDPCVD, PECVD, MOCVD, MBE, UHVCVD, ALD, and photo chemical vapor deposition systems, and various process gases of nitrogen (N$_2$), argon (Ar), silane (SiH$_4$), germane (GeH$_4$) and the like are introduced to deposit Si(Ge) films. Accordingly, p$^+$-type a-Si, i-type a-Si, a-SiGe, n-type µc-Si, µc-SiGe, n-type µc-Ge, and n$^+$-type µc-Si films having different crystalline phases, different doping, and different thicknesses are formed by adjusting film forming process parameters of temperature, pressure, gas flow rate and the like, so as to function as a front contact 206, a first light absorption layer 208, a first transition layer 210, a second light absorption layer 212, a second transition layer 214, a third light absorption layer 216, and a back contact 218, respectively. For the deposition of a-SiGe, generally, SiH$_4$ with a stable flow rate is first introduced, and then GeH$_4$ is slowly introduced to modify Ge content in a SiGe film, so as to form an a-SiGe junction buffer.

Then, a metal electrode 220 is formed by sputtering textured transparent conductive oxide, Ag or Al using an E-gun evaporator. Next, silicon nitride or silicon dioxide is grown as a passivation layer 222 by HDPCVD or PECVD. Finally, a terminal treatment to the films are performed by RTA.

Figure 7:
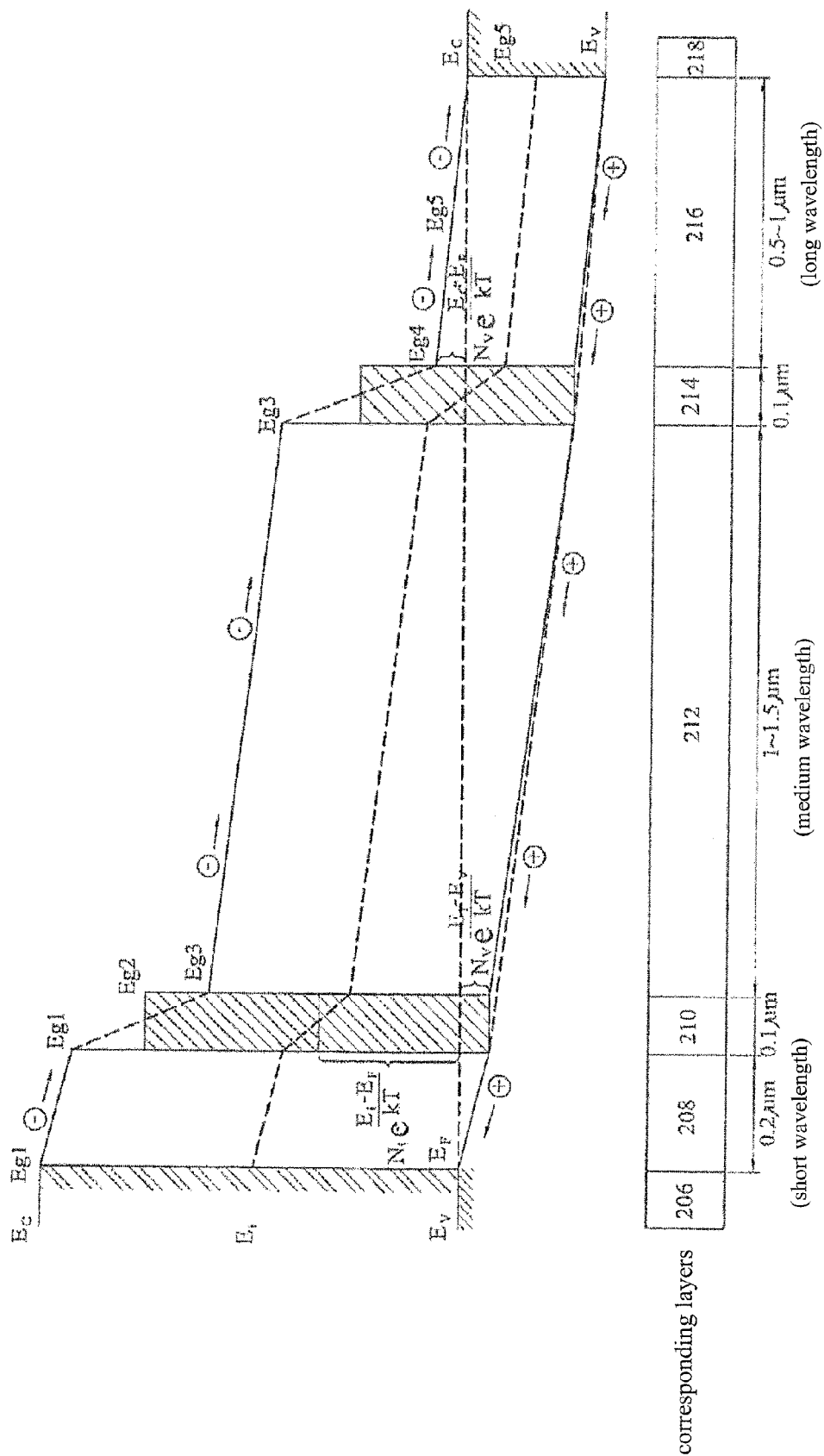
FIG. 7 is a schematic view showing the bandgap of the tandem solar cell showing in FIG. 6.

As shown in FIG. 7, the entire bandgap of the solar cell is made smoother to reduce the probability of hole recombination.

Figure 14A:
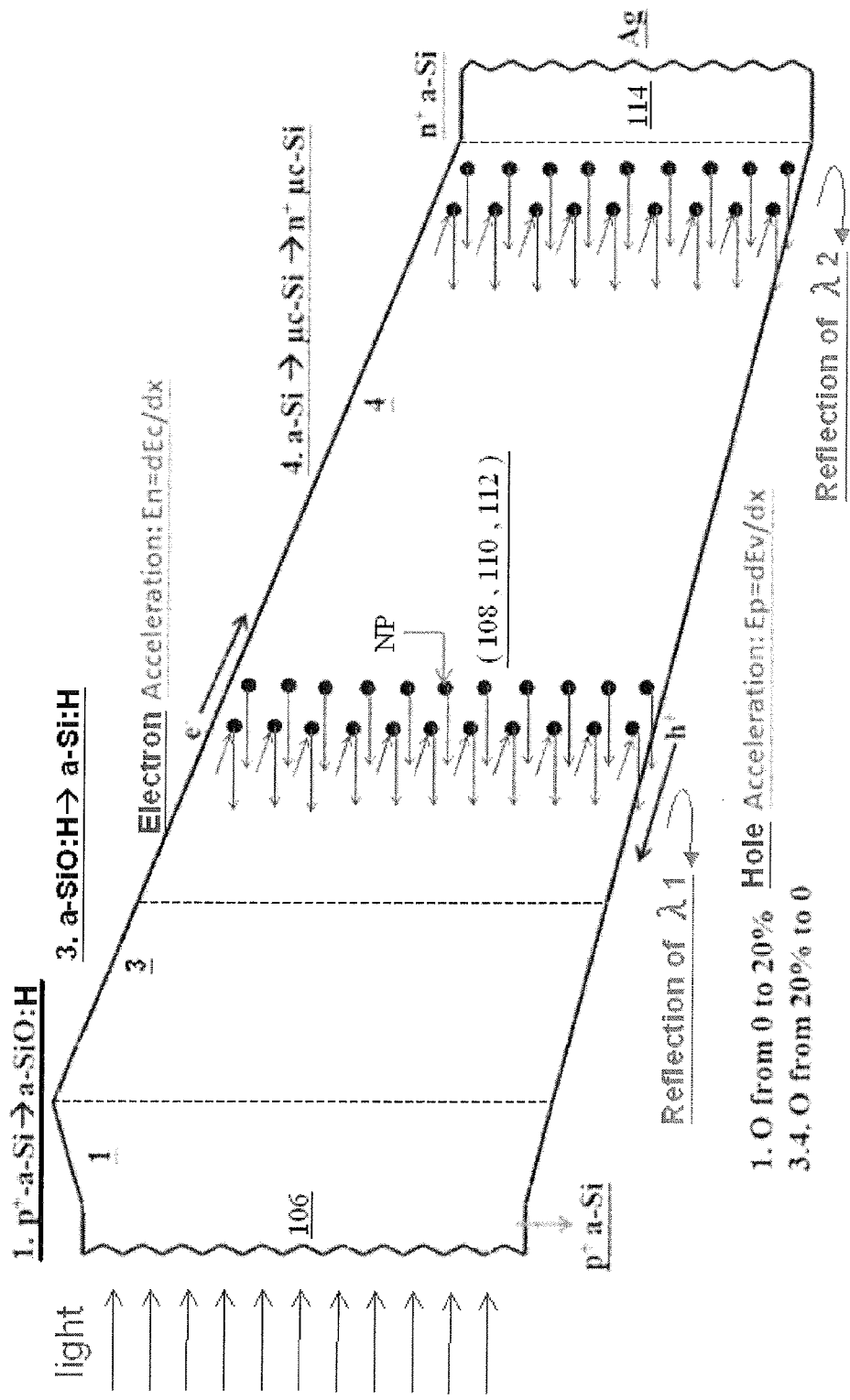
FIG. 14A is a bandgap graph showing the fully graded structure of a heterojunction light absorption layer having nano-particles of the present invention.

FIG. 14A is a bandgap graph showing the fully graded structure of a heterojunction light absorption layer having nano-particles NP of the present invention, in which at least part of the first light absorption layer 108, the transition layer 110 and the second light absorption layer 112 are doped with nano-Particles NP. A layer with p$^+$-type a-Si gradually varied into a-SiO is formed by introducing oxygen into a chamber of a film forming device, after a a-Si layer is grown, by gradually increasing oxygen content in the atmosphere of the chamber from 0% to 20%. Next, a layer with a-SiO:H gradually varied into a-Si, then a layer with a-Si gradually varied into µc-Si and then gradually varied into n$^+$-type µc-Si are formed by gradually adjusting oxygen content in the atmosphere of the chamber from 20% to 0%.

Figure 14B:
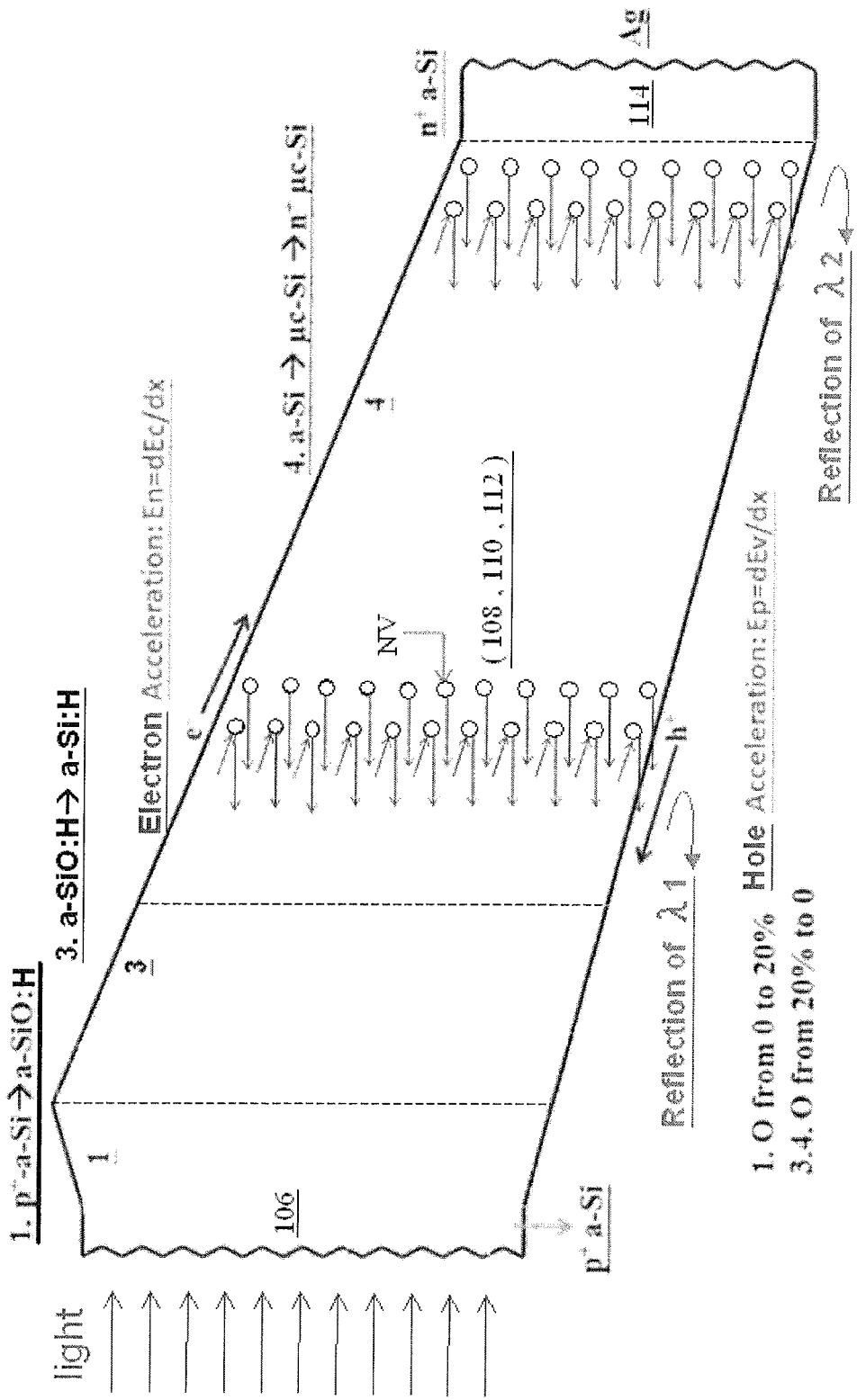
FIG. 14B is a bandgap graph showing the fully graded structure of a heterojunction light absorption layer having nano-voids of the present invention.

Referring to FIG. 14A, the nano-particles NP can make light obliquely incident to the solar cell to generate multiple reflections so as to increase the traveling distance of the light inside the solar cell, and enhance an effect of light trapping in cooperation with the textured transparent conductive layers, which are described above. Also, the nano-particles NP can generate the effect of quantum confinement. Alternatively, in the other embodiment of the present invention, the nano-particles NP could be replaced with Nano-voids NV or air voids to achieve the same object, as shown in FIG. 14B.

Figure 14C:
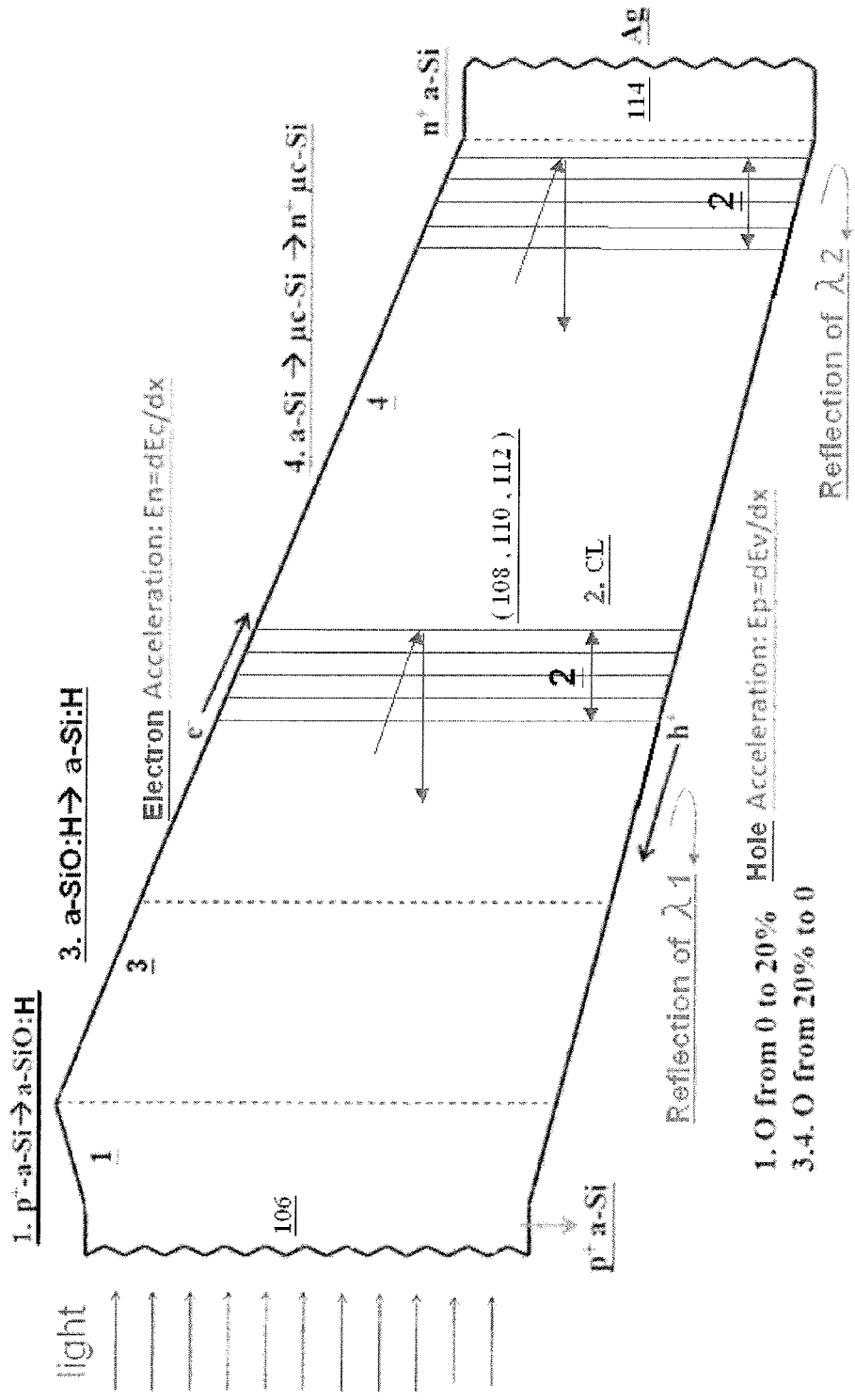
FIG. 14C is a bandgap graph showing the fully graded structure of a heterojunction light absorption layer having semiconductor layers of the present invention.

Similarly, please refer to FIG. 14C, in order to generate multiple reflections to increase the traveling distance of the light inside the solar cell, and enhance the effect of light trapping in cooperation with the textured transparent conductive layers, in another embodiment of the present invention, a plurality of semiconductor layers CL are built into at least one of the first light absorption layer 108, the transition layer 110 and the second light absorption layer 112. Each one of the semiconductor layer CL has different reflex index and is arranged alternatively with another one in a tandem arrangement. As shown in FIG. 14C, the semiconductor layers CL are consist of nano-dimensional superlattices composed of a-SiO$_x$/a-Si a-SiO$_x$/µc-Si or similarities. Hence, the above embodiment can increase the light absorption so as to improve effectively a photo-electric conversion efficiency.

Figure 15:
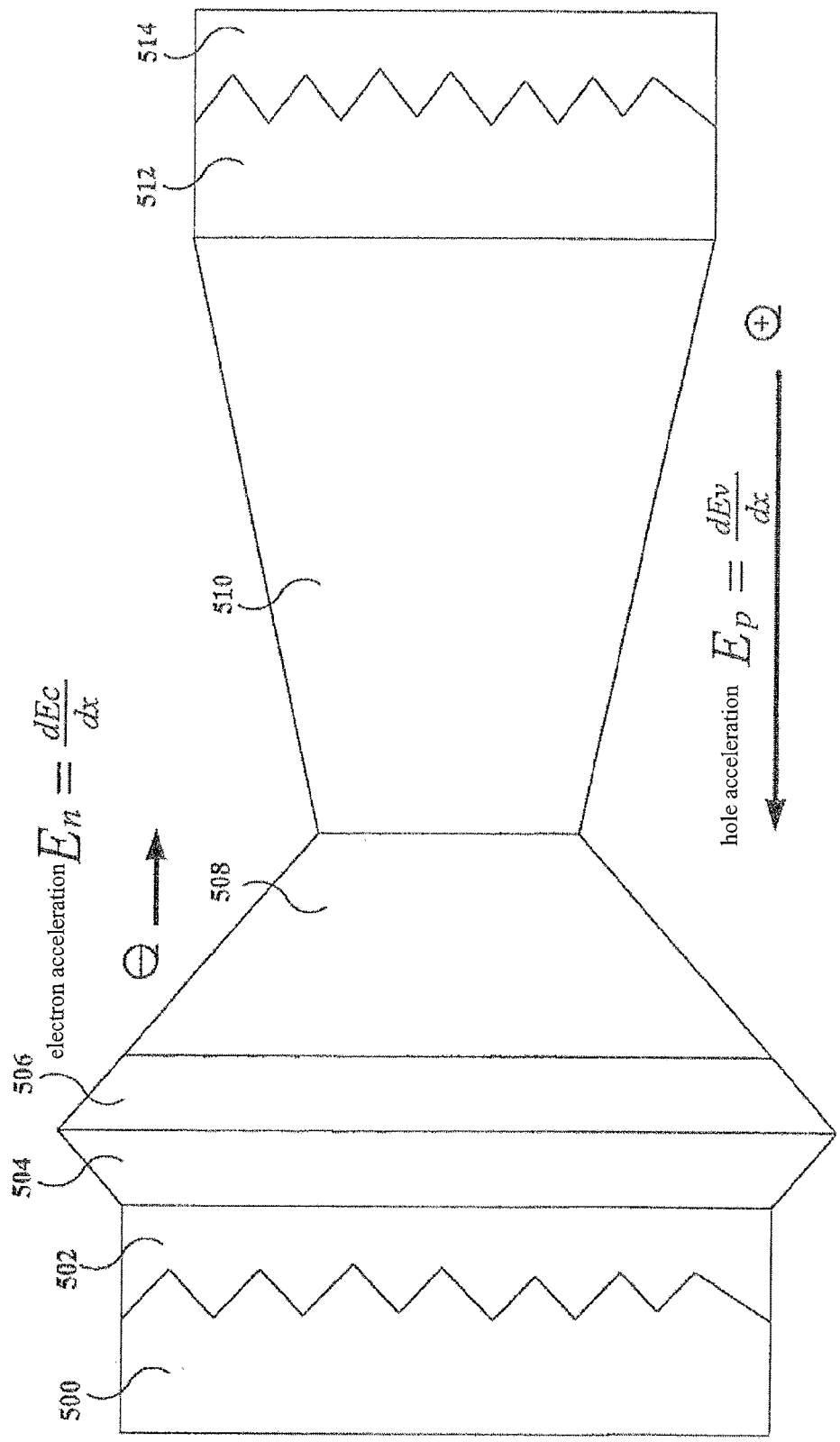
FIG. 15 is a schematic view showing the bandgap of thin-film solar cell according to another aspect of the present invention.

Referring to FIG. 15, a thin-film solar cell comprises: a first electrode 500; a front contact 502, formed on the first electrode 500; a first light absorption layer 504, formed on the front contact 502; a second light absorption layer 506, formed on the first light absorption layer 504; a third light absorption layer 508, formed on the second light absorption layer 506; a fourth light absorption layer 510, formed on the third light absorption layer 508, a back contact 512, formed on the fourth light absorption layer 510; and a second electrode 514, formed on the back contact 512, wherein the first electrode 500 is made of a transparent conductive oxide layer; the front contact 502 is made of p$^+$-type a-Si; the first light absorption layer 504 is made of a-Si gradually varied into a-SiO:H; the second light absorption layer 506 is made of a-SiO:H gradually varied into a-Si; the third light absorption layer 508 is made of a-Si gradually varied into µc-Si or a-Si gradually varied into poly-Si; the fourth light absorption layer 510 is made of µc-Si gradually varied into a-Si or poly-Si gradually varied into a-Si; the back contact 512 is made of n$^+$-type a-Si; and the second electrode 514 is made of a transparent conductive oxide layer, Ag, or Al.

Figure 11:
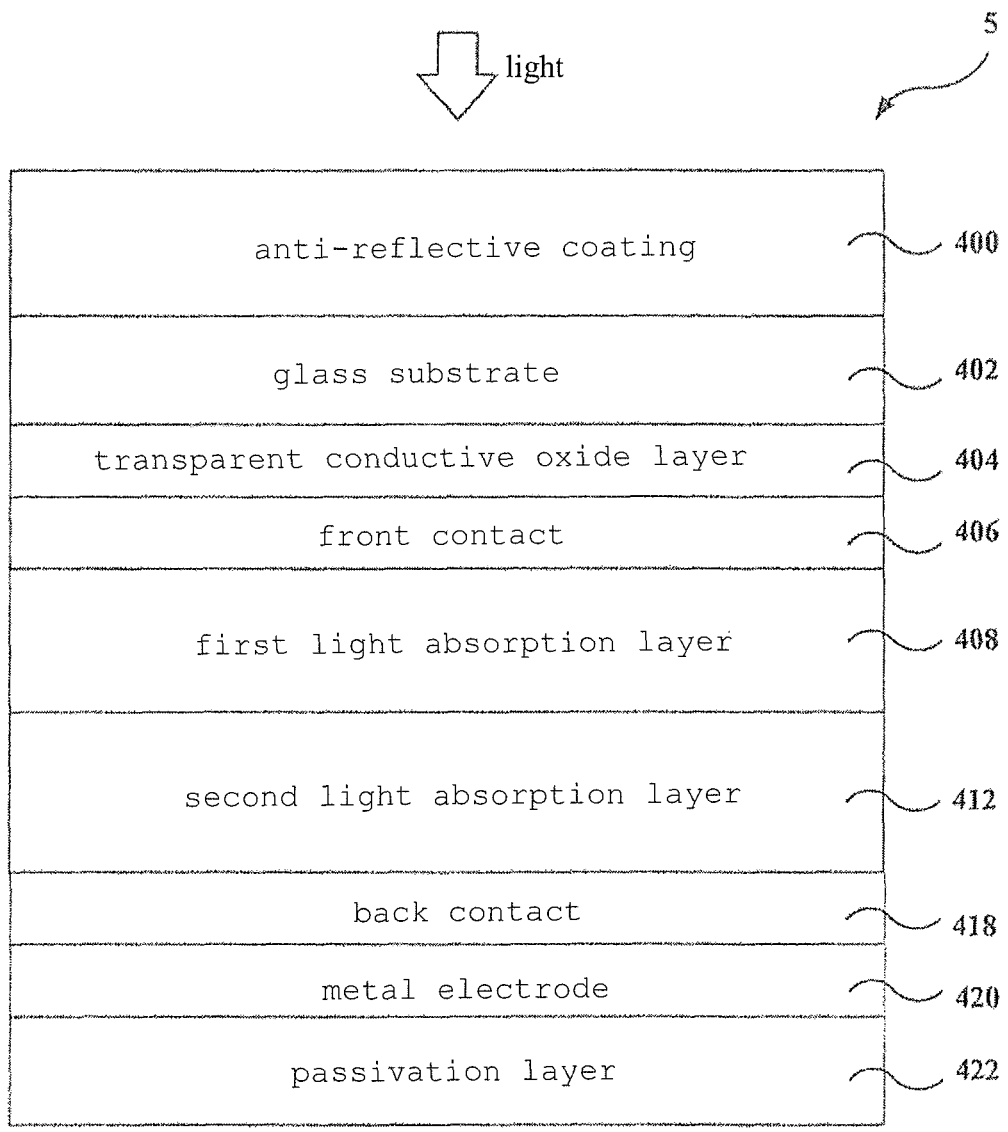
FIG. 11 is a schematic view showing a structure of a solar cell having superlattice layers with different configuration, as a first light absorption layer and a second light absorption layer.
Figure 12:
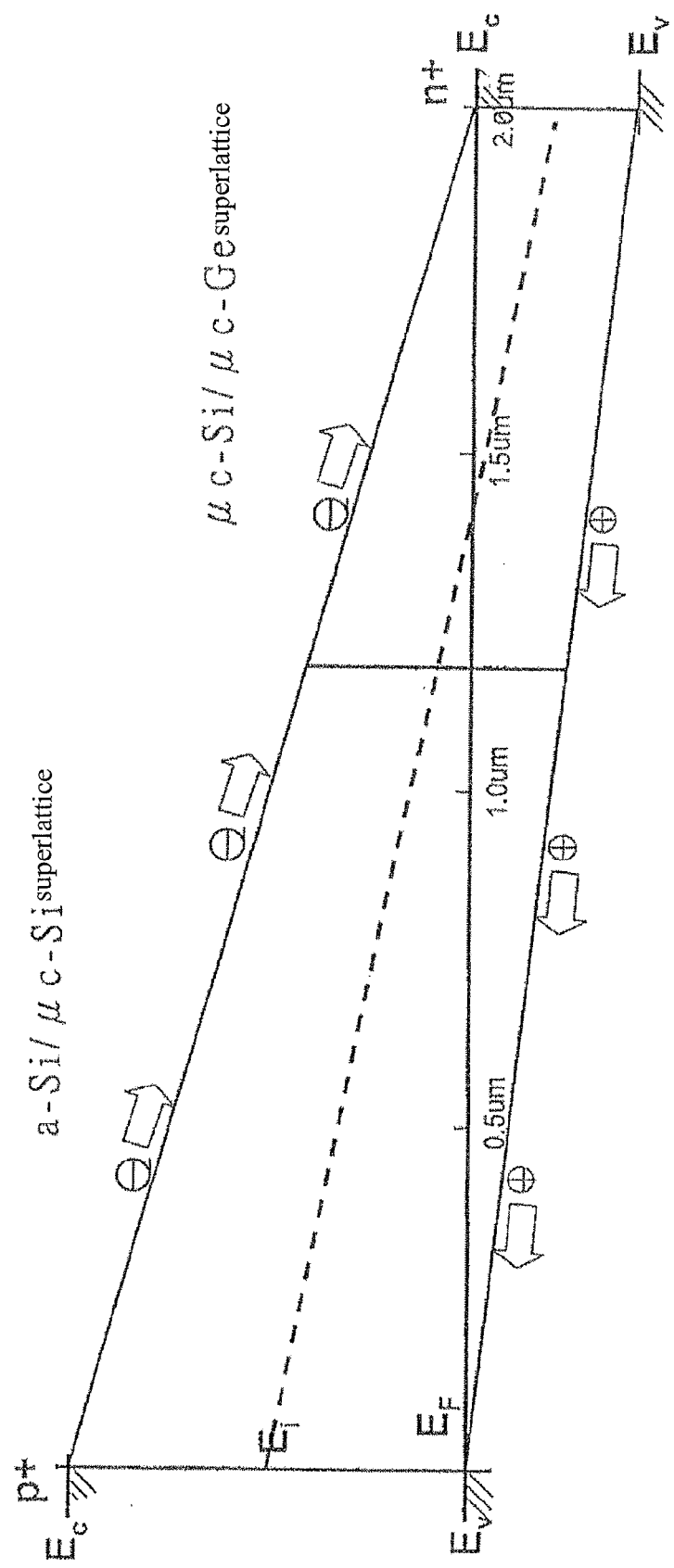
FIG. 12 is a schematic view showing the fully graded bandgap of the solar cell shown in FIG. 11.

FIG. 11 is a schematic view showing a structure of a solar cell having superlattice layers with different configuration, as a first light absorption layer and a second light absorption layer. FIG. 12 is a schematic view showing the fully graded bandgap of the solar cell shown in FIG. 11.

Figure 13:
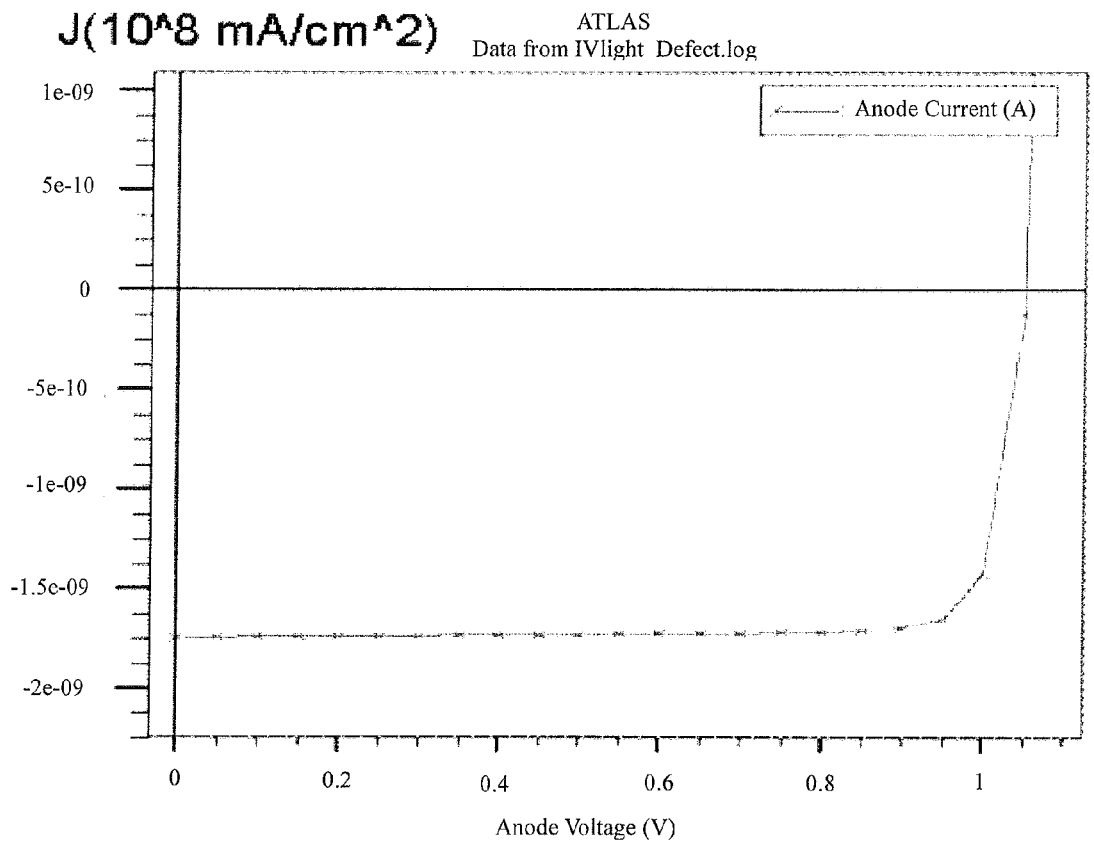
FIG. 13 is a J-V simulation graph of the present invention using a graded p-type a-Si/μc-Si superlattice layer as a transition layer between an i-type a-Si layer and a μc-Si layer.

FIG. 13 is a J-V simulation graph of the present invention where a graded p-type a-Si/µc-Si superlattice layer is used as a transition layer between an i-type a-Si layer and a µc-Si layer, wherein Jsc represents short-circuit current density (unit: mA/cm$^2$), Voc represents open-circuit voltage (unit: V), FF represents fill factor, η represents conversion efficiency, their relations are defined as:

$$\eta = (Voc \times Jsc \times FF \times A)/Pin$$

wherein Pin is intensity of incident light, A is a light receiving area.

It can be seen from the J-V graph of FIG. 13 that in the case of fixing the bandgap of the superlattice layer used as the transition layer as 1.4 eV, the conversion efficiency can reach 15.56%, and in the case of designing the superlattice layer used as the transition layer into a graded bandgap, the conversion efficiency can reach 17.4%.

Figure 16:
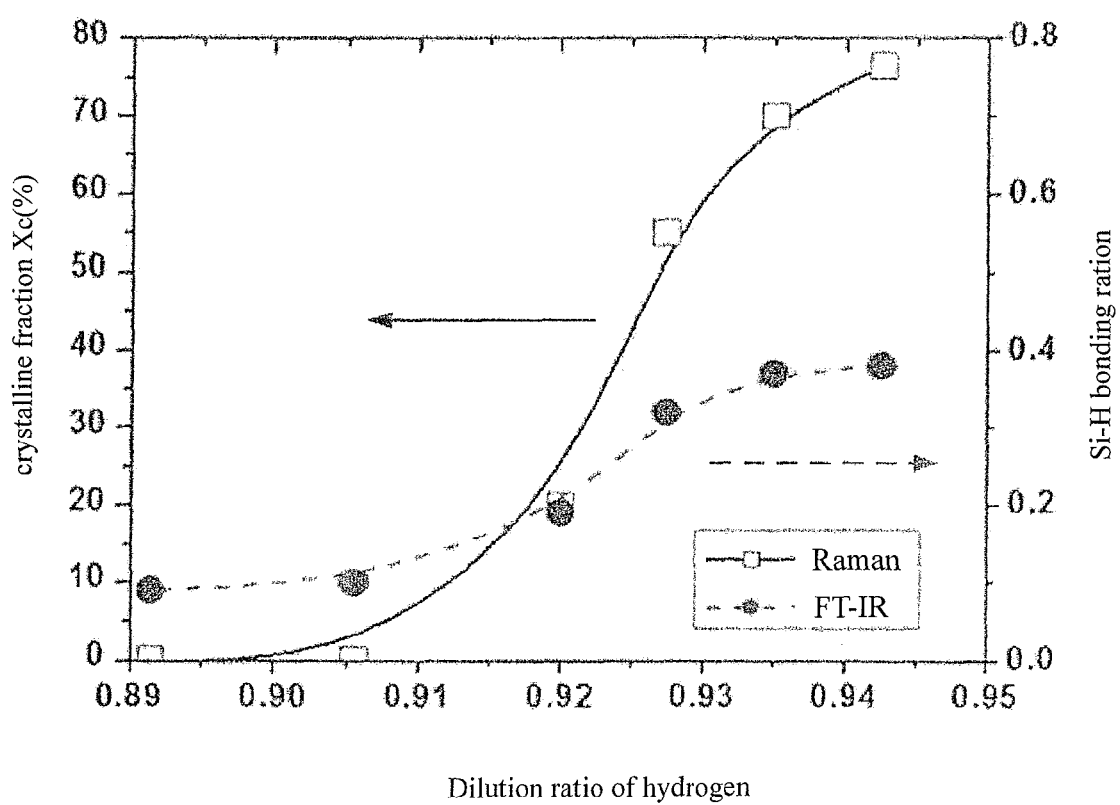
FIG. 16 is a graph showing that the dilution ratio of hydrogen affects degree of crystallization and Si—H bonding.

FIG. 16 is a graph showing that the dilution ratio of hydrogen affects degree of crystallization and Si—H bonding. A crystalline fraction X$_C$ (%) of a layer formed with a-Si gradually varied into µc-Si by adjusting hydrogen content in a process gas during film formation is measured by Raman scatter spectroscopy, wherein it is given that X$_C$=(I$_{520}$)/(I$_{480}$+I$_{520}$), wherein I$_{480}$ is an intensity located at 480 cm$^{-1}$, representing a-Si absorption peak, I$_{520}$ is an intensity located at 520 cm$^{-1}$, representing µc-Si absorption peak. A Si—H bonding ratio R is measured by FT-IR, wherein it is given that R=(I$_{2090}$)/(I$_{2000}$+I$_{2090}$), wherein I$_{2000}$ is an intensity located at 2000 cm$^{-1}$, representing Si—H transmittance peak, I$_{2090}$ is an intensity located at 2090 cm$^{-1}$, representing H—Si—H transmittance peak.

Figure 4:
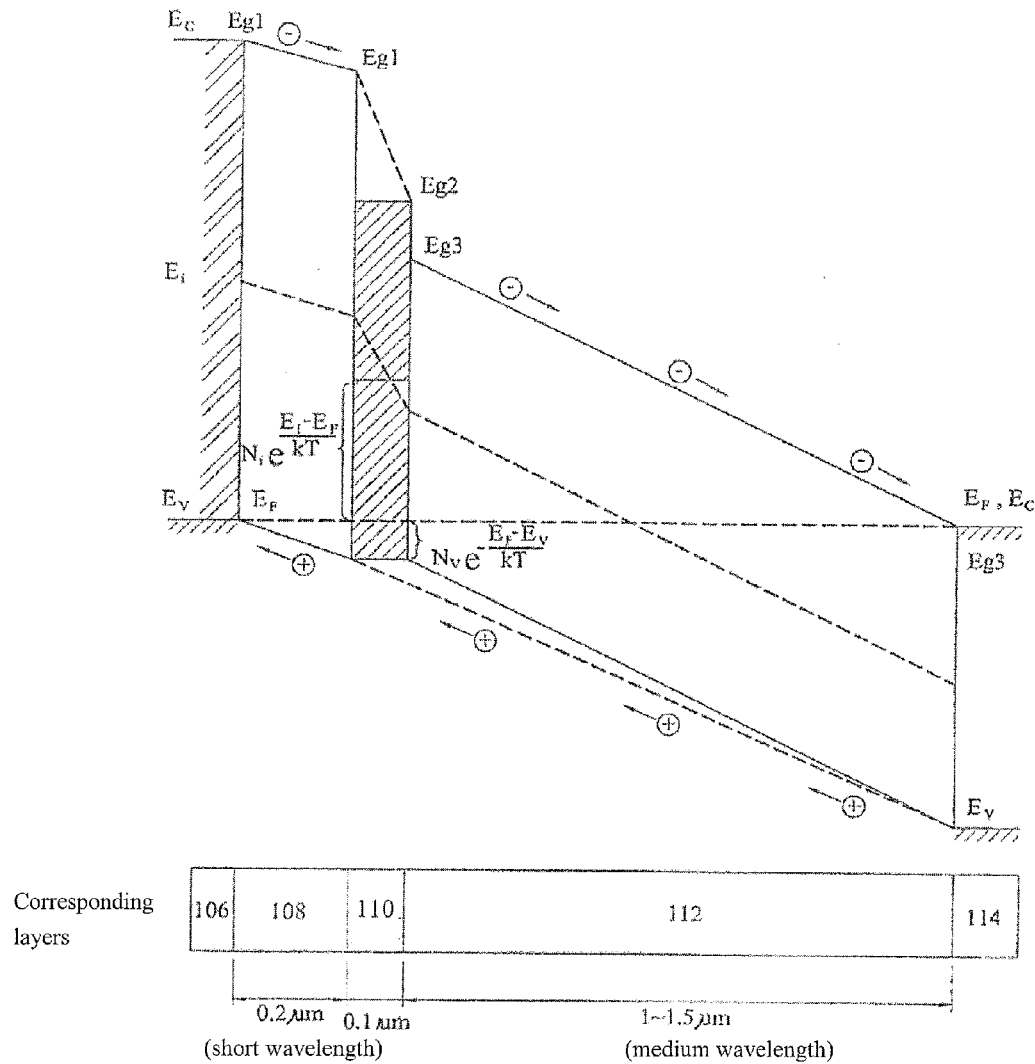
FIG. 4 is a schematic view showing the bandgap of the tandem solar cell showing in FIG. 3.
Figure 17:
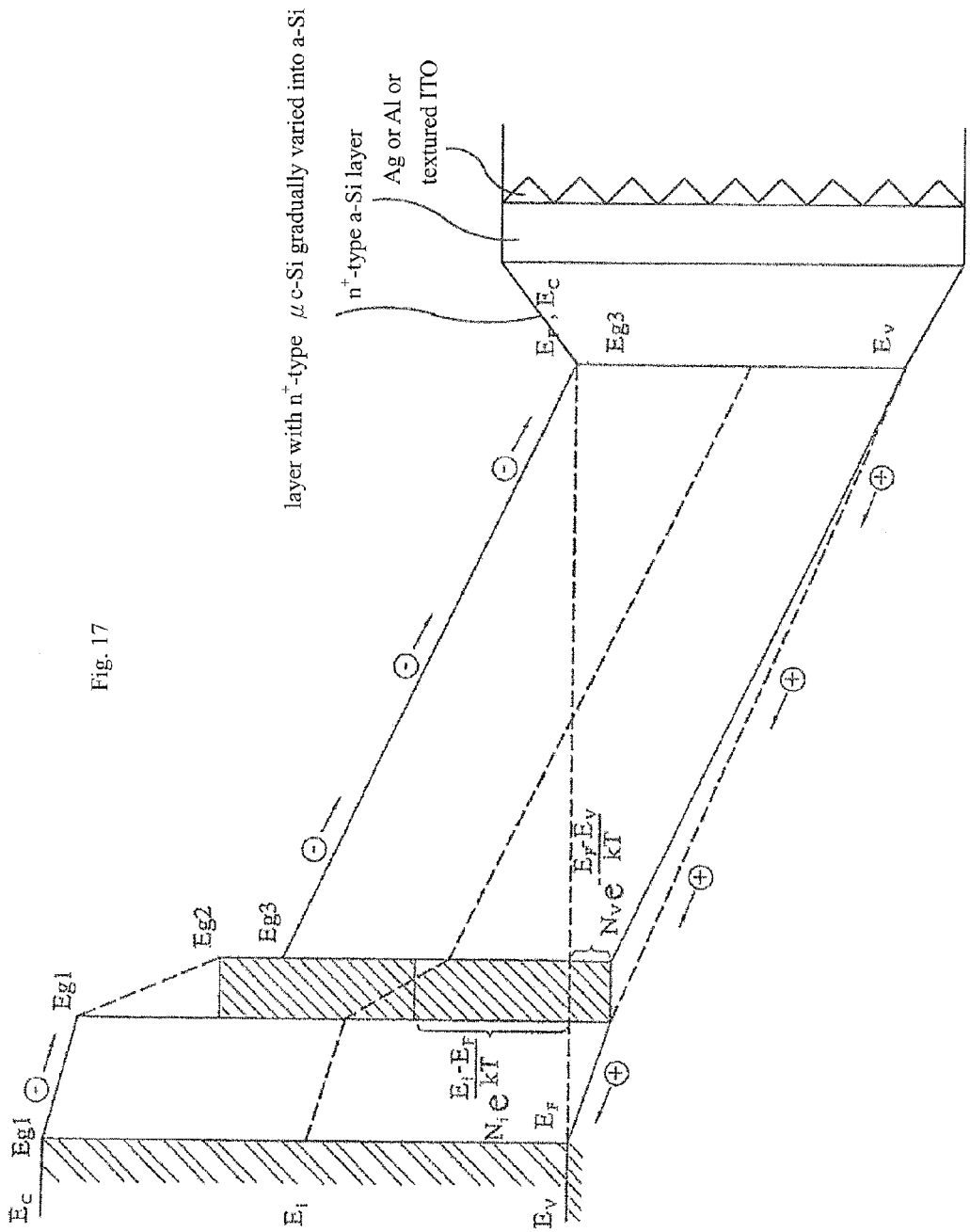
FIG. 17 is a bandgap schematic view of adding a layer with $n^+$-type μc-Si gradually varied into a-Si, an $n^+$-type a-Si layer, and a Ag or Al or textured ITO layer into FIG. 4.
Figure 18:
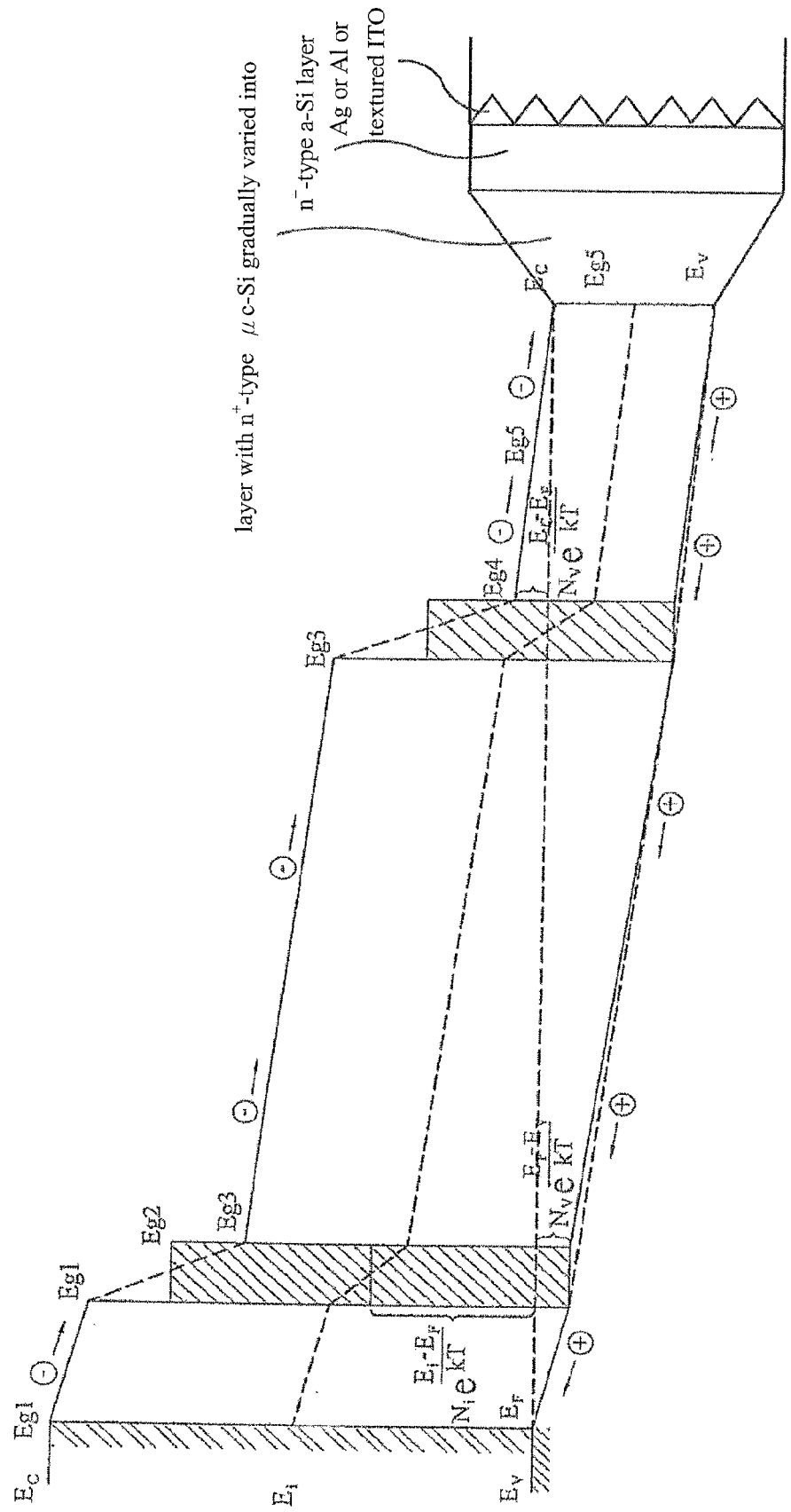
FIG. 18 is a bandgap schematic view of adding a layer with $n^+$-type μc-Si gradually varied into a-Si, an $n^+$-type a-Si layer, and a Ag or Al or textured ITO layer into FIG. 7.

Moreover, in the above solar cell, the back contact is made of an n$^+$-type a-Si layer, and a layer with n$^+$-type µc-Si gradually varied into a-Si is further included between the light absorption layer closest to the back contact and the back contact. FIG. 17 is a bandgap schematic view of adding a layer with n$^+$-type µc-Si gradually varied into a-Si, an n$^+$-type a-Si layer, and a (an) Ag or Al or textured ITO layer into FIG. 4 under such an aspect. FIG. 18 is a bandgap schematic view of adding a layer with n+-type μc-Si gradually varied into a-Si, an n+-type a-Si layer, and a Ag or Al or textured ITO layer into FIG. 7 under such an aspect.

Although the invention has been described with reference to the specific embodiments, ordinary persons skilled in the art can easily make various changes and substitutions without departure from the spirit and scope of the present invention which is determined by the claims below.

LIST OF REFERENCE NUMERALS 1 tandem solar cell
2 tandem solar cell
3 tandem solar cell
4 tandem solar cell
5 tandem solar cell
10 anti-reflective coating
12 glass substrate
14 transparent conductive oxide layer
16 p+-type a-Si layer
18 n-type or i-type a-Si layer
20 n+-type a-Si layer
22 amorphous silicon (a-Si) cell
24 transparent conductive oxide layer
26 p+-type poly-Si or μc-Si layer
28 i-type poly-Si or μc-Si layer
30 n+-type poly-Si or μc-Si layer
32 crystal silicon (c-Si) cell
34 metal electrode
36 passivation layer
100 anti-reflective coating
102 glass substrate
104 transparent conductive oxide layer
106 front contact
108 first light absorption layer
110 transition layer
112 second light absorption layer
114 back contact
116 metal electrode
118 passivation layer
200 anti-reflective coating
202 glass substrate
204 transparent conductive oxide layer
206 front contact
208 first light absorption layer
210 first transition layer
212 second light absorption layer
214 second transition layer
216 third light absorption layer
218 back contact
220 metal electrode
222 passivation layer
300 anti-reflective coating
302 glass substrate
304 transparent conductive oxide layer
306 front contact
308 light absorption layer
314 back contact
316 metal electrode
318 passivation layer
400 anti-reflective coating
402 glass substrate
404 transparent conductive oxide layer
406 front contact
408 first light absorption layer
412 second light absorption layer
418 back contact
420 metal electrode
422 passivation layer
500 first electrode
502 front contact
504 first light absorption layer
506 second light absorption layer
508 third light absorption layer
510 fourth light absorption layer
512 back contact
514 second electrode
1101 first superlattice layer
1102 second superlattice layer
Arr1 first array
Arr2 second array
CL semiconductor layer
NP nano-particle
NV Nano-void
S10~S130 steps
$a_1, b_1, a_i, b_i, a_n, b_n, a_{n+1}$
$b_{n+1}, a_{n+j}, b_{n+j}, a_{n+m}, b_{n+m}$,
d, f, W1, W2 thickness

What is claimed is:

1. A thin film solar cell with a graded bandgap structure, comprising:
a front contact;
a first light absorption layer, formed on the front contact;
a transition layer, formed on the first light absorption layer, the transition layer having a graded bandgap;
a second light absorption layer, formed on the transition layer; and
a back contact, formed on the second light absorption layer, wherein the transition layer comprises a plurality of first superlattice layers and a plurality of second superlattice layers, the first superlattice layers being made of a photosensitive material with a first bandgap, the second superlattice layers being made of a photosensitive material with a second bandgap; and each one of the first superlattice layers is alternated with each one of the second superlattice layers in a tandem arrangement; and wherein a thickness of each one of the first superlattice layers is gradually thinned from an initial thickness to a specific thickness, and then gradually thickened to the initial thickness; a thickness of each one of the second superlattice layers is gradually thickened from an initial thickness to a specific thickness, and then gradually thinned to the initial thickness, such that the graded bandgap of the transition layer is gradually decreased first and then increased.

2. The thin film solar cell as claimed in claim 1, wherein the first light absorption layer is made of a photosensitive material with the first bandgap, which is larger than the second bandgap.

3. The thin film solar cell as claimed in claim 1, wherein the thin film solar cell is provided with two or more arrays in a tandem arrangement, each of the arrays being formed by the first light absorption layer, the transition layer and the second light absorption layer.

4. The thin film solar cell as claimed in claim 1, wherein at least one of the first light absorption layer, the transition layer and the second light absorption layer is doped with a plurality of Nano-particles therein, the Nano-particles being selected from at least one of semiconductors, metals and composite materials thereof.

5. The thin film solar cell as claimed in claim 1, wherein at least one of the first light absorption layer, the transition layer and the second light absorption layer is doped with a plurality of Nano-voids.

6. The thin film solar cell as claimed in claim 1, wherein at least one of the first light absorption layer, the transition layer and the second light absorption layer is provided with a plurality of semiconductor layers therein, each semiconductor layer having different reflex index and being arranged by alternation with another semiconductor layer in tandem.

* * * * *